(12) United States Patent
Lamy et al.

(10) Patent No.: US 11,784,610 B2
(45) Date of Patent: Oct. 10, 2023

(54) DOHERTY AMPLIFIER MODULE WITH COMPACT WIDEBAND IMPEDANCE INVERTER

(71) Applicant: NXP USA, Inc., Austin, TX (US)

(72) Inventors: Anthony Lamy, Tournefeuille (FR); Olivier Lembeye, Saint Lys (FR)

(73) Assignee: NXP USA, Inc., Austin, TX (US)

( * ) Notice: Subject to any disclaimer, the term of this patent is extended or adjusted under 35 U.S.C. 154(b) by 346 days.

(21) Appl. No.: 17/190,570

(22) Filed: Mar. 3, 2021

(65) Prior Publication Data

US 2021/0281221 A1  Sep. 9, 2021

(30) Foreign Application Priority Data

Mar. 3, 2020 (EP) .................................. 20305222

(51) Int. Cl.
*H03F 1/02* (2006.01)
*H03F 3/21* (2006.01)
*H03K 5/00* (2006.01)

(52) U.S. Cl.
CPC ............. *H03F 1/0288* (2013.01); *H03F 3/21* (2013.01); *H03K 5/00* (2013.01); *H03F 2200/451* (2013.01); *H03K 2005/00286* (2013.01)

(58) Field of Classification Search
CPC ............. H03F 1/0288; H03F 3/21; H03K 5/00
See application file for complete search history.

(56) References Cited

U.S. PATENT DOCUMENTS

| 7,521,995 | B1 | 4/2009 | Krvavac | |
|---|---|---|---|---|
| 8,749,306 | B2 | 6/2014 | Pengelly | |
| 11,233,483 | B2* | 1/2022 | Bouisse | H03F 3/195 |
| 2009/0179702 | A1* | 7/2009 | Blednov | H03F 3/195 330/277 |
| 2014/0347133 | A1* | 11/2014 | Qureshi | H03F 1/07 330/295 |
| 2018/0175799 | A1 | 6/2018 | Wu et al. | |
| 2018/0269845 | A1* | 9/2018 | Arigong | H03H 7/19 |
| 2020/0212864 | A1* | 7/2020 | Flemming | H01P 11/003 |
| 2022/0278652 | A1* | 9/2022 | Kato | H03F 1/0288 |

OTHER PUBLICATIONS

Ledezma, Luis M.; "Doherty Power Amplifier with Lumped Non-Foster Impedance Inverter";2015 Texas Symposium on Wireless and Microwave circuits and Systems (WMCS); Waco, TX US; 4 pages (Apr. 23-24, 2015).

* cited by examiner

*Primary Examiner* — Patricia T Nguyen

(57) ABSTRACT

Embodiments of a device and method are disclosed. In an embodiment, a Doherty amplifier module includes a first amplifier die with a first output terminal, a second amplifier die with a second output terminal, and a wideband impedance inverter circuit electrically coupled between the first and second output terminals. The wideband impedance inverter circuit includes a network of capacitors, the network of capacitors including at least a series capacitor having a positive capacitance, a first shunt circuit having a first negative capacitance, and a second shunt circuit having a second negative capacitance.

13 Claims, 7 Drawing Sheets

DOHERTY AMPLIFIER MODULE WITH COMPACT WIDEBAND IMPEDANCE INVERTER

CROSS-REFERENCE TO RELATED APPLICATION

This patent application claims priority under 35 USC 119 to European Patent Application Number 20305222.0, filed on Mar. 3, 2020.

BACKGROUND

Wireless communication systems employ power amplifiers for increasing the power of radio frequency (RF) signals. In a wireless communication system, a power amplifier forms a portion of the last amplification stage in a transmission chain before provision of the amplified signal to an antenna for radiation over the air interface. High gain, high linearity, stability, and a high level of power-added efficiency are characteristics of a desirable amplifier in such a wireless communication system.

In general, a power amplifier operates at maximum power efficiency when the power amplifier transmits close to saturated power. However, power efficiency tends to worsen as output power decreases. Recently, the Doherty amplifier architecture has been the focus of attention not only for base stations but also for mobile terminals because of the architecture's high power-added efficiency over a wide power dynamic range.

With the increasing need for system miniaturization, however, conventional architectures of the Doherty amplifier often present challenges to efforts toward reducing semiconductor package sizes.

SUMMARY

Embodiments of a device and method are disclosed. In an embodiment, a Doherty amplifier module includes a first amplifier die with a first output terminal, a second amplifier die with a second output terminal, and a wideband impedance inverter circuit electrically coupled between the first and second output terminals. The wideband impedance inverter circuit includes a network of capacitors, the network of capacitors including at least a series capacitor having a positive capacitance, a first shunt circuit having a first negative capacitance, and a second shunt circuit having a second negative capacitance.

In an embodiment, the first shunt circuit is coupled to a first terminal of the series capacitor and the second shunt circuit is coupled to a second terminal of the series capacitor, and wherein a magnitude of the positive capacitance of the series capacitor is approximately equal to a magnitude of the first negative capacitance of the first shunt circuit and a magnitude of the second negative capacitance of the second shunt circuit.

In an embodiment, the Doherty amplifier module further includes a first output circuit coupled between the first output terminal of the first amplifier die and an output of the wideband impedance inverter circuit, the first output circuit including at least a third shunt capacitor adjacent to the first shunt circuit. The first negative capacitance of the first shunt circuit is absorbed by the third shunt capacitor. The Doherty amplifier module further includes a second output circuit coupled between the second output terminal of the second amplifier die and an input of the wideband impedance inverter circuit, the second output circuit including at least a fourth shunt capacitor adjacent to the second shunt circuit. The second negative capacitance of the second shunt circuit is absorbed by the fourth shunt capacitor.

In an embodiment, the series capacitor, and the third and fourth shunt capacitors are lumped elements.

In an embodiment, the Doherty amplifier module further includes a first output circuit coupled between the first output terminal of the first amplifier die and an output of the wideband impedance inverter circuit, and a second output circuit coupled between the second output terminal of the second amplifier die and an input of the wideband impedance inverter circuit. The first output circuit is configured to apply a first phase shift to a first amplified radio frequency (RF) signal produced by the first amplifier die, the second output circuit is configured to apply a second phase shift to a second amplified RF signal produced by the second amplifier die, and the wideband impedance inverter circuit is configured to apply a third phase shift to the second amplified RF signal. The wideband impedance inverter circuit is configured to apply the third phase shift without using a quarter wavelength transmission line.

In an embodiment, an amount of the third phase shift applied by the wideband impedance inverter circuit is constant over a frequency range of the second amplified RF signal.

In an embodiment, the output of the wideband impedance inverter circuit is electrically coupled to a combining node configured to combine the first amplified RF signal and the second amplified RF signal. The first, second, and third phase shifts are each approximately 90 degrees. The first output circuit, the second output circuit, and the wideband impedance inverter circuit are configured so that, during operation of the Doherty amplifier, the first and second amplified RF signals arrive approximately in phase at the combining node.

In an embodiment, the wideband impedance inverter circuit provides an extended impedance bandwidth.

Embodiments of a device and method are disclosed. In an embodiment, a Doherty amplifier module includes a carrier amplifier with a first output terminal, a peaking amplifier with a second output terminal, a first output circuit including at least a first surface mount capacitor, wherein an input of the first output circuit is coupled to the first output terminal, a second output circuit including at least a second surface mount capacitor, wherein an input of the second output circuit is coupled to the second output terminal, and a third surface mount capacitor. A first terminal of the third surface mount capacitor is coupled to an output of the first output circuit, and the second terminal of the third surface mount capacitor is coupled to an output of the second output circuit.

In an embodiment, the first, second, and third surface mount capacitors operate as a wideband impedance inverter circuit.

In an embodiment, the first, second, and third surface mount capacitors are configured to form a PI network. The first and second surface mount capacitors are shunt capacitors in the PI network and third surface mount capacitor is a series capacitor in the PI network.

In an embodiment, the first output circuit is configured to apply a first phase shift to a first amplified radio frequency (RF) signal produced by the carrier amplifier, and the second output circuit is configured to apply a second phase shift to a second amplified RF signal produced by the peaking amplifier. The PI network is configured to apply a third phase shift to the second amplified RF signal produced by the peaking amplifier.

In an embodiment, an amount of the third phase shift applied by the PI network is constant over a frequency range of the second amplified RF signal.

In an embodiment, the first, second, and third phase shifts are each approximately 90 degrees.

In an embodiment, the output of the first output circuit is electrically coupled to a combining node configured to combine the first amplified RF signal and the second amplified RF signal. The first and second amplified RF signals arrive approximately in phase at the combining node.

In an embodiment, a method of fabricating a Doherty amplifier module includes attaching a first amplifier die with a first output terminal and a second amplifier die with a second output terminal to the mounting surface, attaching first and second output circuits to the mounting surface, the first output circuit including at least a first shunt circuit and the second output circuit including at least a second shunt circuit, attaching at least one capacitor of a wideband impedance inverter circuit to the mounting surface, electrically coupling the first output terminal to an input of the first output circuit and electrically coupling the second output terminal to an input of the second output circuit; and electrically coupling a first terminal of the at least one capacitor to an output of the first output circuit and electrically coupling the second terminal of the at least one capacitor to an output of the second output circuit. The wideband impedance inverter circuit includes the at least one capacitor and the first and second shunt circuits.

In an embodiment, the at least one capacitor and the first and second shunt circuits include surface mount components.

In an embodiment, at least one capacitor and the first and second shunt circuits form a PI network, and wherein the at least one capacitor comprises at least one series capacitor.

In an embodiment, the first output circuit is configured to apply a first phase shift to a first amplified radio frequency (RF) signal produced by the first amplifier die, and the second output circuit is configured to apply a second phase shift to a second amplified RF signal produced by the second amplifier die. The lumped element PI network is configured to apply a third phase shift to the second amplified RF signal produced by the second amplifier die.

In an embodiment, the first, second, and third phase shifts are each approximately 90 degrees.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

Figure 1:
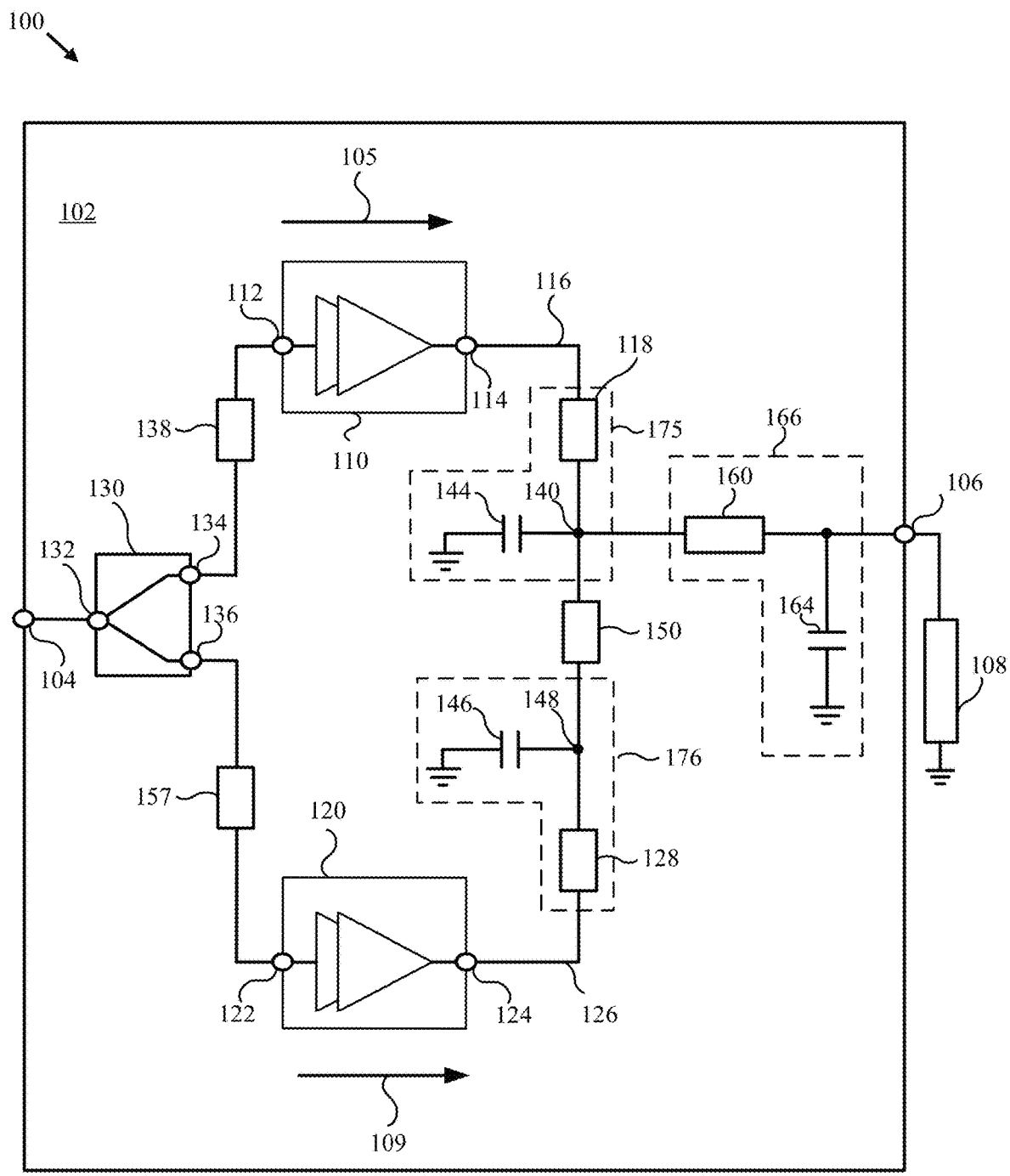
FIG. 1 depicts a schematic diagram of a Doherty amplifier in accordance with various embodiments of the disclosure.

It will be readily understood that the components of the embodiments as generally described herein and illustrated in the appended figures could be arranged and designed in a wide variety of different configurations. Thus, the following more detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its spirit or essential characteristics. The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment", "an embodiment", or similar language means that a particular feature, structure, or characteristic described in connection with the indicated embodiment is included in at least one embodiment of the present invention. Thus, the phrases "in one embodiment", "in an embodiment", and similar language throughout this specification may, but do not necessarily, all refer to the same embodiment.

The embodiments described herein are directed to radio frequency (RF) signal amplifier devices. For example, the embodiments described herein may be implemented in two-way Doherty amplifier modules. In a two-way Doherty amplifier, for example, an input signal (e.g., a radio frequency (RF) input signal) is provided to a power splitter. The power splitter divides the RF input signal into two RF signals with equal or unequal power, applies a phase shift to one or both of the two RF signals to achieve about a 90 degree phase difference between the signals, and provides the two RF signals to the carrier and peaking amplifiers. The two RF signals are then separately amplified by the carrier amplifier and the peaking amplifier of the Doherty amplifier and combined at an output stage.

When the RF input signal power level is relatively low, only the carrier amplifier actively amplifies its received RF signal to produce an amplified RF signal, which is provided to the load. At a given RF input signal power threshold, the peaking amplifier begins actively amplifying its received RF signal, and the carrier and peaking amplifiers both output amplified RF signals that are combined, in phase, at the combining node and provided to the load. As the RF input signal power level continues to increase, the peaking amplifier output signal level also increases up to a full-power output condition. Doherty amplifier operation at power levels below the full-power output condition is referred to as "back-off operation."

In some conventional Doherty amplifier architectures, such as a "90°/180°" Doherty amplifier, a quarter wavelength ($\lambda/4$) transmission line is coupled between the carrier amplifier output and the signal combiner (also referred to as a combining node), and two quarter wavelength transmission lines are coupled in series between the peaking amplifier output and the signal combiner. Each quarter wavelength ($\lambda/4$) transmission line may operate as a phase offset line. Accordingly, each quarter wavelength ($\lambda/4$) transmission line may apply a phase shift (e.g., an approximately 90 degree phase shift) to the amplified RF signals output from the carrier and peaking amplifiers. This may compensate for the previously discussed 90 degree phase difference between the RF input signals and may ensure that the separately amplified RF signals provided from the carrier and peaking amplifiers arrive in phase at the combining node. In some architectures, the quarter wavelength ($\lambda/4$) transmission line(s) may also be used to maximize the impedance seen from the carrier amplifier looking into the combining node to prevent a reduction in efficiency and/or linearity of the Doherty amplifier. For example, the characteristic impedance of the quarter wavelength ($\lambda/4$) transmission line may be chosen such that both carrier and peaking amplifiers see their optimum load resistance to provide maximum power and efficiency.

However, implementation of the previously described quarter wavelength ($\lambda/4$) transmission line(s) in a Doherty amplifier module typically requires placement of one or more lengthy and wide conductive paths on a mounting surface of a substrate. As such, each quarter wavelength ($\lambda/4$) transmission line may consume a significant amount of area on the mounting surface, which may impose limitations on the minimum footprint size of the Doherty amplifier circuit. This may present difficult challenges with respect to reducing the size of the Doherty amplifier module.

In addition, the quarter wavelength ($\lambda/4$) transmission line(s) typically implemented in conventional Doherty amplifier circuits may not apply a constant phase shift (e.g., an approximately 90 degree phase shift) over a range of frequencies. For example, if the frequency of an RF signal deviates from the center frequency for which the transmission line is designed to apply an intended phase shift of approximately 90 degrees, the quarter wavelength ($\lambda/4$) transmission line may apply a phase shift that is different than the intended phase shift. This may result in phase misalignment between the carrier and peaking signals at the combining node, which may reduce the efficiency of the Doherty amplifier and degrade performance.

Finally, and as discussed herein, the impedance bandwidth of a quarter wavelength ($\lambda/4$) transmission line may not be adequate in some scenarios. As a result, the performance of the Doherty amplifier may be further degraded.

FIG. 1 is a schematic diagram of a Doherty amplifier 100 (also referred to as a two-way Doherty amplifier 100), in accordance with an example embodiment. As indicated in FIG. 1 with box 102, some or all components of Doherty amplifier 100 may be implemented in a single device package or module. For example, box 102 may represent a substrate of the single device package or module. In an embodiment, the Doherty amplifier 100 includes an RF input node 104, an RF output node 106, a power splitter 130, and a combining node 140 (also referred to as a summing node). When incorporated into a larger RF system, the RF input node 104 is coupled to an RF signal source (not illustrated), and the RF output node 106 is coupled to a load 108 (e.g., an antenna or other load). The RF signal source provides an input RF signal, which is an analog signal that includes spectral energy that typically is centered around one or more carrier frequencies. Fundamentally, the Doherty amplifier 100 is configured to amplify the input RF signal, and to produce an amplified RF output signal at the RF output node 106.

In an embodiment, the power splitter 130 has an input 132 and two outputs 134, 136. The power splitter input 132 is coupled to the RF input node 104 to receive the input RF signal. The power splitter 130 is configured to divide the RF input signal received at input 132 into first and second RF signals. In one example implementation, the splitter 130 may include a 90 degree hybrid coupler (also referred to as a hybrid coupler) to divide the RF signal and achieve a phase difference between the output signals in a small footprint. Such hybrid coupler may maintain a quasi-constant phase difference (e.g., a phase difference of 90 degrees) between a through port of the hybrid coupler and a coupled port of the hybrid coupler over a range of frequencies.

The first RF signal (also referred to as a carrier signal) may be provided to a first amplifier die 110 (also referred to as a carrier amplifier die 110) through output 134 and the second RF signal (also referred to as a peaking signal) may be provided to a second amplifier die 120 (also referred to as a peaking amplifier die 120) through output 136. In some embodiments, the power splitter 130 may include one or more phase shift elements configured to impart one or more phase shifts to the first and second RF signals to establish a phase difference (also referred to as a phase delay) between the first and second RF signals at the outputs 134, 136 (e.g., a phase shift of approximately 90 degrees). Accordingly, in one example, the first RF signal provided to the input 112 of the carrier amplifier die 110 may be approximately 90 degrees out of phase with the second RF signal provided to the peaking amplifier die 120. In some embodiments, a phase shifter circuit may be implemented outside of the power splitter 130. In one example, such phase shifter circuit may apply a phase shift (e.g., phase delay) of approximately 90 degrees to the first RF signal (e.g., the carrier signal).

When Doherty amplifier 100 has a symmetrical configuration (i.e., a configuration in which the carrier and peaking amplifiers include power transistors that are substantially identical in size or power handling capability), the power splitter 130 may divide or split the input RF signal received at the input 132 into two signals that have approximately equal power. Conversely, when Doherty amplifier 100 has an asymmetrical configuration (i.e., a configuration in which the second amplifier includes a power transistor that is significantly larger than the power transistor in the first amplifier), the power splitter 130 may output signals having unequal power. In some embodiments, the power splitter 130 may be implemented with fixed-value, passive components. In other embodiments, the power splitter 130 may be implemented with one or more controllable variable attenuators and/or variable phase shifters, which enable the power splitter 130 to attenuate and/or phase shift the first and second RF signals based on externally-provided control signals.

As shown in FIG. 1, Doherty amplifier 100 includes carrier amplifier die 110 and peaking amplifier die 120, according to an embodiment. Each amplifier die 110, 120 includes an input terminal 112, 122 proximate to a first edge of the amplifier die 110, 120, and output terminal 114, 124 proximate to a second edge of the amplifier die 110, 120 that is opposite (and parallel to) the first edge. One or more power transistors are electrically connected between each of the input and output terminals.

The outputs 134, 136 of the power splitter 130 are connected to the first and second signal paths 105, 109 respectively. The first signal path 105 includes a first input circuit 138, the carrier amplifier die 110, and a first output circuit 175. In some embodiments, the first input circuit 138 may include a plurality of discrete and/or integrated components (e.g., inductors and capacitors) configured to provide proper impedance matching between the output 134 of the power splitter 130 and the input to the carrier amplifier die 110. The carrier amplifier die 110 is configured to receive the first RF signal from the power splitter 130 at input terminal 112, to amplify the first RF signal, and to provide the amplified first RF signal at RF output terminal 114. The amplified first RF signal is conveyed from the RF output terminal 114 to the first output circuit 175 via a first signal line 116. In some embodiments, at least a portion of the first signal line 116 may be implemented as a wirebond array including a plurality of parallel wires that extend from a bonding pad coupled to RF output terminal 114 to a conductive trace or contact on the substrate of the Doherty amplifier 100.

The first output circuit 175 provides the amplified first RF signal to a combining node 140. In some embodiments, the first output circuit 175 may include one or more discrete and/or integrated components (e.g., capacitors, inductors, and/or resistors) configured to provide the desired impedance matching and to impart a desired phase shift. In the embodiment of FIG. 1, the first output circuit 175 includes a first transmission line 118 (e.g., a microstrip transmission line) and a first shunt capacitor 144.

The second signal path 109 is similarly configured to amplify the second RF signal. More specifically, the second signal path 109 includes a second input circuit 157, the peaking amplifier die 120, and a second output circuit 176. The peaking amplifier die 120 is configured to receive the second RF signal from the power splitter 130 at input terminal 122, to amplify the second RF signal, and to provide the amplified second RF signal at RF output terminal 124. The amplified second RF signal is conveyed from the RF output terminal 124 to the second output circuit 176 via a second signal line 126. In some embodiments, at least a portion of the second signal line 126 may be implemented as a wirebond array including a plurality of parallel wires that extend from a bonding pad coupled to RF output terminal 124 to a conductive trace or contact on the substrate of the Doherty amplifier 100.

The second output circuit 176 provides the amplified second RF signal to node 148. In some embodiments, the second output circuit 176 may include one or more discrete and/or integrated components (e.g., capacitors, inductors, and/or resistors) configured to provide the desired impedance matching and to impart a desired phase shift. In the embodiment of FIG. 1, the second output circuit 176 includes a second transmission line 128 (e.g., a microstrip transmission line) and a second shunt capacitor 146.

As shown in FIG. 1, the second signal path 109 further includes a lumped element circuit 150 electrically coupled between the node 148 and the combining node 140. Accordingly, the amplified second RF signal may be provided to the combining node 140 through the lumped element circuit 150. In some embodiments, and as explained in detail with reference to FIGS. 2 and 3, the lumped element circuit 150 may include a PI network that serves as a compact wideband impedance inverter. For example, the PI network may include a series coupled capacitor having a positive capacitance value, and two shunt capacitors having negative capacitance values. In the aspects described herein, a shunt capacitor having a negative capacitance value may represent an amount of capacitance that is to be reduced from an adjacent capacitor having a positive capacitance value. For example, the adjacent capacitor may be a shunt capacitor coupled to a same node as the shunt capacitor having the negative capacitance value. When a negative capacitance value is reduced from an adjacent capacitor having a positive capacitance value, the adjacent capacitor having the positive capacitance value may be said to absorb the negative capacitance value. Essentially, a negative capacitance means a positive voltage across the capacitor terminals when the charge is negative. In some embodiments, the lumped element circuit 150 may provide impedance inversion and/or may apply a phase shift to the amplified second RF signal.

The Doherty amplifier 100 is designed so that, during operation, the amplified first and second RF signals combine substantially in phase at the combining node 140 to produce an amplified and combined RF output signal. As shown in FIG. 1, the combining node 140 is electrically coupled to the RF output node 106 to provide the amplified and combined RF output signal to the RF output node 106. In an embodiment, an output impedance matching network 166 between the combining node 140 and the RF output node 106 functions to present proper load impedances to each of the carrier and peaking amplifier dies 110, 120. The resulting amplified RF output signal is produced at RF output node 106, to which an output load 108 (e.g., an antenna) is connected.

As mentioned above, along the first signal path 105, the carrier amplifier die 110 includes an RF input terminal 112, an RF output terminal 114, and one or more amplification stages coupled between the input and output terminals 112, 114. The RF input terminal 112 is coupled to the first output 134 of the power splitter 130, and thus the RF input terminal 112 receives the first RF signal that was produced by the power splitter 130. Along the second amplifier path 109, the peaking amplifier die 120 includes an RF input terminal 122, an RF output terminal 124, and one or more amplification stages coupled between the input and output terminals 122, 124. The RF input terminal 122 is coupled to the second output 136 of the power splitter 130, and thus the RF input terminal 122 receives the second RF signal that was produced by the power splitter 130.

Each amplification stage of the carrier amplifier die 110 includes a power transistor. More specifically, each power transistor includes a control terminal (e.g., a gate terminal) and first and second current-carrying terminals (e.g., a drain terminal and a source terminal). In a single-stage device, which would include a single power transistor, the control terminal is electrically connected to the RF input terminal 112, one of the current-carrying terminals (e.g., the drain terminal or the source terminal) is electrically connected to the RF output terminal 114, and the other current-carrying terminal (e.g., the source terminal or the drain terminal) is electrically connected to a ground reference (or another voltage reference). Conversely, a two-stage device would include two power transistors coupled in series, where a first transistor functions as a driver amplifier transistor that provides relatively high gain amplification, and a second transistor functions as an output amplifier transistor that provides relatively low gain amplification. In such an embodiment, the control terminal of the driver amplifier transistor is electrically connected to the RF input terminal 112, one of the current-carrying terminals of the driver amplifier transistor (e.g., the drain terminal or the source terminal) is electrically connected to the control terminal of the output amplifier transistor, and the other current-carrying terminal of the driver amplifier transistor (e.g., the source terminal or the drain terminal) is electrically connected to the ground reference (or another voltage reference). Additionally, one of the current-carrying terminals of the output amplifier transistor (e.g., the drain terminal or the source terminal) is electrically connected to the RF output terminal 114, and the other current-carrying terminal of the output amplifier transistor (e.g., the source terminal or the drain terminal) is electrically connected to the ground reference (or another voltage reference).

In addition to the power transistor(s), portions of input and output impedance matching networks and bias circuitry (not illustrated in FIG. 1) also may be monolithically formed as portions of the carrier amplifier die 110. Further, in an embodiment in which the carrier amplifier die 110 is a two-stage device, an interstage matching network (not illustrated in FIG. 1) also may be monolithically formed as a portion of the carrier amplifier die 110.

As with the carrier amplifier die 110, each amplification stage of the peaking amplifier die 120 includes a power transistor with a control terminal and first and second current-carrying terminals. The power transistor(s) of the peaking amplifier die 120 may be electrically coupled between the RF input and output terminals 122, 124 in a manner similar to that described above in conjunction with the description of the carrier amplifier die 110. Additional other details discussed in conjunction with the description of the carrier amplifier die 110 also apply to the peaking amplifier die 120, and those additional details are not reiterated here for brevity.

The Doherty amplifier 100 may be configured so that the first signal path 105 (also referred to as a carrier signal path) provides amplification for relatively low level input signals. As the magnitude of the input signal increases, a first input power level is reached at which the second signal path 109 (also referred to as a peaking signal path) also becomes active. This may be accomplished, for example, by biasing the carrier amplifier die 110, such that the carrier amplifier die 110 operates in a class AB mode, and biasing the peaking amplifier die 120 such that the peaking amplifier die 120 operates in a class C mode.

Figure 2:
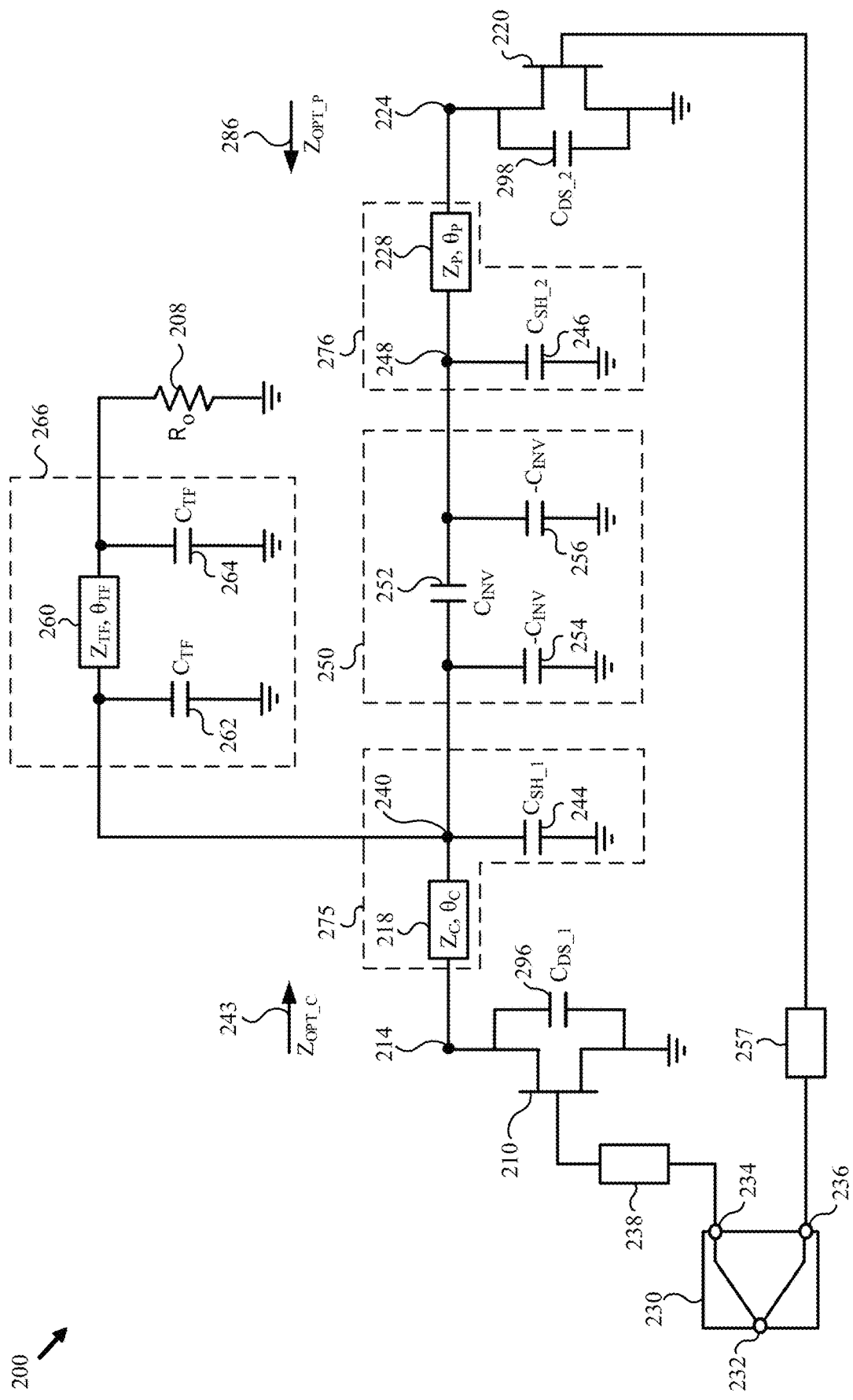
FIG. 2 depicts a schematic diagram of a Doherty amplifier in accordance with various embodiments of the disclosure.

The operation and design of the Doherty amplifier 100 will now be described with reference to the circuits 200, 300 shown in FIGS. 2 and 3. The circuit 200 is a schematic diagram representing the Doherty amplifier 100 in FIG. 1. With reference to FIG. 2, the circuit 200 includes a power splitter 230, a first power transistor 210, a second power transistor 220, and a load 208. In the embodiment of FIG. 2, the first power transistor 210 may be an output power transistor in the carrier amplifier die 110 in FIG. 1 and the second power transistor 220 may be an output power transistor in the peaking amplifier die 120 in FIG. 1. In FIG. 2, the internal drain-source capacitance (also referred to as a parasitic capacitance or junction capacitance) of the first power transistor 210 is indicated as the capacitance $C_{DS\_1}$ 296 and the internal drain-source capacitance of the second power transistor 220 is indicated as the capacitance $C_{DS\_2}$ 298. Therefore, it should be understood that the capacitances $C_{DS\_1}$ 296, $C_{DS\_2}$ 298, shown in FIG. 2 do not represent physical components.

As shown in FIG. 2, the output of the first power transistor 210 (e.g., the RF output terminal 114 of the carrier amplifier die 110) is coupled to the combining node 240 via the first output circuit 275. In an embodiment, the output of the first power transistor 210 is the drain terminal of the first power transistor 210 coupled to the first node 214. The first output circuit 275 may include an impedance transformer configured to present a proper output impedance to the output of the first power transistor 210, and may be configured to apply a phase shift (e.g., a phase shift of approximately 90 degrees) to an amplified RF signal output from the first power transistor 210.

For example, and as shown in FIG. 2, the first output circuit 275 may be implemented with a first transmission line 218 (e.g., the first transmission line 118) coupled between the output of the first power transistor 210 and the combining node 240, and with a first shunt capacitor 244 coupled between the combining node 240 and ground. In one embodiment, the capacitance $C_{SH\_1}$ of the first shunt capacitor 244 may be selected to be approximately equal to the capacitance $C_{DS\_1}$ 296. In this embodiment, both ends of the first transmission line 218 (e.g., at nodes 214, 240) may be considered coupled to shunt capacitors having approximately equal capacitance values, which may enable a reduction in the length of the first transmission line 218 (also referred to as a first reduced-length transmission line 218). As indicated in FIG. 2, the first transmission line 218 may have a characteristic impedance $Z_C$.

As further shown in FIG. 2, the output of the second power transistor 220 (e.g., the RF output terminal 124 of the carrier amplifier die 120) is coupled to the combining node 240 via the second output circuit 276 and the wideband impedance inverter circuit 250. In an embodiment, the output of the second power transistor 220 is the drain terminal of the second power transistor 220 coupled to the second node 224. The second output circuit 276 may include an impedance transformer configured to present a proper output impedance to the output of the second power transistor 210, and may be configured to apply a phase shift (e.g., a phase shift of approximately 90 degrees) to an amplified RF signal output from the second power transistor 220.

For example, and as shown in FIG. 2, the second output circuit 276 may be implemented with a second transmission line 228 (e.g., the second transmission line 128) coupled between the output of the second power transistor 220 and the third node 248, and with a second shunt capacitor 246 coupled between the third node 248 and ground. In one embodiment, the capacitance $C_{SH\_2}$ of the second shunt capacitor 246 may be selected to be approximately equal to the capacitance $C_{DS\_2}$ 298. In this embodiment, both sides of the second transmission line 228 (e.g., at nodes 224, 248) may be considered coupled to shunt capacitors having approximately equal capacitance values, which may enable a reduction in the length of the second transmission line 228 (also referred to as a second reduced-length transmission line 228). As indicated in FIG. 2, the second transmission line 228 may have a characteristic impedance $Z_P$.

As shown in FIG. 2, the output of the second output circuit 276 (e.g., node 248) is coupled to the combining node 240 via the wideband impedance inverter circuit 250. The wideband impedance inverter circuit 250 may enable impedance matching and may apply a phase shift (e.g., a phase shift of approximately 90 degrees) to an amplified RF signal output from the second power transistor 220. In some embodiments, the wideband impedance inverter circuit 250 may be implemented as a lumped element circuit (also referred to as a lumped element network or a lumped element PI network) including at least one series capacitor having a positive capacitance and at least two shunt parallel circuits/capacitors having negative capacitances. In some embodiments, the negative capacitances of each of the shunt parallel circuits/capacitors and the positive capacitance of the series capacitor may be equal in magnitude. For example, and as shown in FIG. 2, the wideband impedance inverter circuit 250 may be a lumped element PI network including a series capacitor 252 having a capacitance $C_{INV}$ and parallel shunt circuits/capacitors 254, 256 each having a capacitance $-C_{INV}$. In some embodiments, and as discussed in detail with reference to FIG. 3, each of the parallel shunt circuits/capacitors 254, 256 having the capacitance $-C_{INV}$ may be absorbed by an adjacent capacitor having a positive capacitance (e.g., the first shunt capacitor 244 adjacent to the parallel shunt circuit/capacitor 254, the second shunt capacitor 246 adjacent to the parallel shunt circuit/capacitor 256). In some implementations, the series capacitor 252 having the capacitance $C_{INV}$ may be replaced with N series capacitors (e.g., N≥2) having a total approximate capacitance $C_{INV}$. Accordingly, the term "capacitor", as used herein, may mean a single capacitor or a network of series-coupled (and/or parallel-coupled) capacitors. In these implementations, circuit sensitivity to capacitor manufacturing tolerances may be reduced.

As further shown in FIG. 2, the combining node 240 is coupled to the output of load 208 via an output impedance matching network 266 to present proper load impedances to each of the first and second power transistors 210, 220. In one embodiment, the output impedance matching network 266 may be implemented with a third transmission line 260 (e.g., a microstrip transmission line) coupled between the combining node 240 and the load 208, and with third and fourth shunt capacitors 262, 264. As shown in FIG. 2, the third shunt capacitor 262 may be coupled between the combining node 240 and ground. In one embodiment, each of the third and fourth shunt capacitors 262, 264 may have an approximately equal capacitance value (e.g., capacitance $C_{TF}$). Therefore, as shown in FIG. 2, both ends of the third transmission line 260 may be coupled to shunt capacitors having approximately equal capacitance values, which may enable a reduction in the length of the third transmission line 260 (also referred to as a third reduced-length transmission line 260). As indicated in FIG. 2, the first transmission line 218 may have a characteristic impedance $Z_{TF}$.

The power splitter 230 (e.g., power splitter 130) has an input 232 (e.g., input 132 in FIG. 1) and two output terminals 234, 236 (e.g., outputs 134, 136, in FIG. 1). The power splitter input 230 may receive an input RF signal and may divide the RF input signal into first and second RF signals. The power splitter 230 may provide the first RF signal from the output terminal 234 to the gate of the first power transistor 210 via a first input circuit 238 (e.g., the first input circuit 138 in FIG. 1). The first power transistor 210 may provide an amplified first RF signal to the first node 214 (e.g., the RF output terminal 114). The first output circuit 275 may receive the amplified first RF signal at the first node 214 and may provide the amplified first RF signal to the combining node 240. In an embodiment, the first output circuit 275 may apply a 90 degree phase shift to the amplified first RF signal.

The power splitter 230 may provide the second RF signal from the output terminal 236 to the gate of the second power transistor 220 via a second input circuit 257 (e.g., the second input circuit 157 in FIG. 1). The second power transistor 220 may provide an amplified second RF signal to the second node 224 (e.g., the RF output terminal 124). The second output circuit 276 may receive the amplified second RF signal at the second node 224 and may provide the amplified second RF signal to the third node 248. In an embodiment, the second output circuit 276 may apply a 90 degree phase shift to the amplified second RF signal. The wideband impedance inverter circuit 250 may receive the amplified second RF signal at the third node 248 and may provide the amplified second RF signal to the combining node 240. In an embodiment, the second output circuit 276 may apply a 90 degree phase shift to the amplified second RF signal.

The amplified first and second RF signals may be summed in phase at the combining node 240 to produce an amplified RF output signal. The amplified RF output signal may be provided to the load Ro 208 (e.g., load 108 in FIG. 1) via the output impedance matching network 266. In some embodiments, the output impedance matching network 266 may apply an approximately 90 degree phase shift to the amplified RF output signal.

In some embodiments, the power splitter 230 may apply an approximately 90 degree phase shift to the second RF signal from the output terminal 236 and may not apply a phase shift to the first RF signal from the output terminal 234. Therefore, in these embodiments, the first RF signal may be said to lead the second RF signal by approximately 90 degrees. As previously discussed, the first output circuit 275 may apply an approximately 90 degree phase shift to the amplified first RF signal provided by the first power transistor 210, while the second output circuit 276 may apply an approximately 90 degree lag phase shift, and the wideband impedance inverter circuit 250 may apply an approximately 90 degree lead phase shift to the amplified second RF signal provided by the second power transistor 220. Therefore, the phase of the amplified first RF signal is shifted by approximately 90 degrees between the first node 214 (e.g., the RF output terminal 114 in FIG. 1) and the combining node 240, and the phase of the amplified second RF signal is shifted by a total of approximately zero degrees between the second node 224 (e.g., the RF output terminal 124 in FIG. 1) and the combining node 240.

It should be noted that the second output circuit 276 and the wideband impedance inverter circuit 250 may collectively form a virtually zero degree insertion phase circuit. For example, the phase of the amplified second RF signal may be shifted by a total of approximately zero degrees between the second node 224 and the combining node 240 because the combination of the 90 degree lag phase shift applied by the second output circuit 276 and the 90 degree lead phase shift applied by the wideband impedance inverter circuit 250 results in a total phase shift of approximately zero degrees. It should be further noted that the approximately 90 degree phase shift applied to the amplified first RF signal by the first output circuit 275 compensates for the approximately 90 degree phase shift applied to the second RF signal by the power splitter 230.

The phase alignment properties of the wideband impedance inverter circuit 250 will now be discussed. To maintain high power efficiency of the circuit 200 (e.g., Doherty amplifier 100), the phase of the amplified first RF signal (e.g., the amplified carrier signal) should be approximately aligned with the phase of the amplified second RF signal (e.g., the amplified peaking signal) when the amplified first and second RF signals arrive at the combining node 240. In some embodiments, the wideband impedance inverter circuit 250 may enable phase alignment between the amplified first and second RF signals by applying a constant phase shift (e.g., an approximately 90 degree phase shift) to the amplified second RF signal independent of the frequency of the amplified second RF signal. This benefit may be referred to as wideband Doherty amplifier path phase alignment. For example, the lumped element PI network of the wideband impedance inverter circuit 250 including the series capacitor 252 and the parallel shunt circuits/capacitors 254, 256 may apply a phase shift of approximately 90 degrees to the amplified second RF signal despite a significant variation (e.g., variations up to and exceeding 400 megahertz (MHz)) in the frequency of the amplified second RF signal.

The extended impedance bandwidth of the wideband impedance inverter circuit 250 will now be discussed. When the circuit 200 (e.g., Doherty amplifier 100) is operating in a low-power mode, the first power transistor 210 (e.g., the carrier amplifier die 110) is ON (i.e., conducting current) and the second power transistor 220 (e.g., the peaking amplifier die 110) is OFF (i.e., not conducting significant current). Therefore, in the low-power mode, the impedance presented at the combining node 240 by the signal path of the amplified second RF signal (e.g., the impedance observed at the combining node 240 when looking toward the second power transistor 220) should be sufficiently large to maintain proper operation of the first power transistor 210. Otherwise, if the impedance of the signal path of the amplified second RF signal is not sufficiently large, the linearity and efficiency of the first power transistor 210 may be degraded.

In conventional Doherty amplifiers, the previously discussed sufficiently large impedance at a combining node is typically achieved using a transmission line (e.g., a quarter wavelength transmission line) or a phase offset line. However, the impedance presented at the combining node 240 by the second power transistor 220 may not be an adequate amount of impedance (e.g., the transmission line may be too frequency selective) if the frequency of an RF signal falls outside of a small frequency range. Therefore, the transmission line may have a limited impedance bandwidth due to the frequency selectivity of the transmission line and may degrade the performance of a Doherty amplifier in some scenarios.

In some embodiments, the wideband impedance inverter circuit 250 may present a sufficiently large impedance at the combining node 240 (e.g., the impedance observed at the combining node 240 when looking toward the second power transistor 220) over an extended range of frequencies (also referred to as an extended impedance bandwidth) as compared to the previously described limited impedance bandwidth of a transmission line. In one example, the wideband impedance inverter circuit 250 may provide an impedance of 300 Ohms or greater over an approximately 10% fractional bandwidth with respect to a target frequency (e.g., a bandwidth up to or exceeding 200 MHz at a target frequency of 2.0 GHz). The wideband impedance inverter circuit 250 may provide the sufficiently large impedance over an extended range of frequencies because the lumped element PI network including the series capacitor 252 and the parallel shunt circuits/capacitors 254, 256 have a frequency independent phase characteristic, which may reduce impedance dispersion over a range of frequencies.

An example implementation of the wideband impedance inverter circuit 250 will now be described. As previously discussed, the parallel shunt circuits/capacitors 254, 256 having a negative capacitance (e.g., capacitance $-C_{INV}$) may be inserted into a physical circuit by allowing adjacent capacitors to effectively absorb the negative capacitance of the parallel shunt circuits/capacitors 254, 256. For example, the first shunt capacitor 244 having the capacitance $C_{SH\_1}$ may absorb the negative capacitance (e.g., capacitance $-C_{INV}$) of the parallel shunt circuit/capacitor 254. Accordingly, in this example, the first shunt capacitor 244 may have a capacitance $C_{SH\_1}-C_{INV}$. Similarly, the second shunt capacitor 246 having the capacitance $C_{SH\_2}$ may absorb the negative capacitance (e.g., capacitance $-C_{INV}$) of the parallel shunt circuit/capacitor 256. In this example, the second shunt capacitor 246 may have a capacitance $C_{SH\_2}-C_{INV}$. In some embodiments, to reduce the number of physical components needed to implement the circuit 200, the third shunt capacitor 262 may be removed by adding the capacitance $C_{TF}$ of the third shunt capacitor 262 to the first shunt capacitor 244. In these embodiments, the capacitance of the first shunt capacitor 244 may be expressed as $C_{SH\_1}-C_{INV}+C_{TF}$. The result of these modifications to the circuit 200 is shown in the circuit 300 of FIG. 3.

Figure 3:
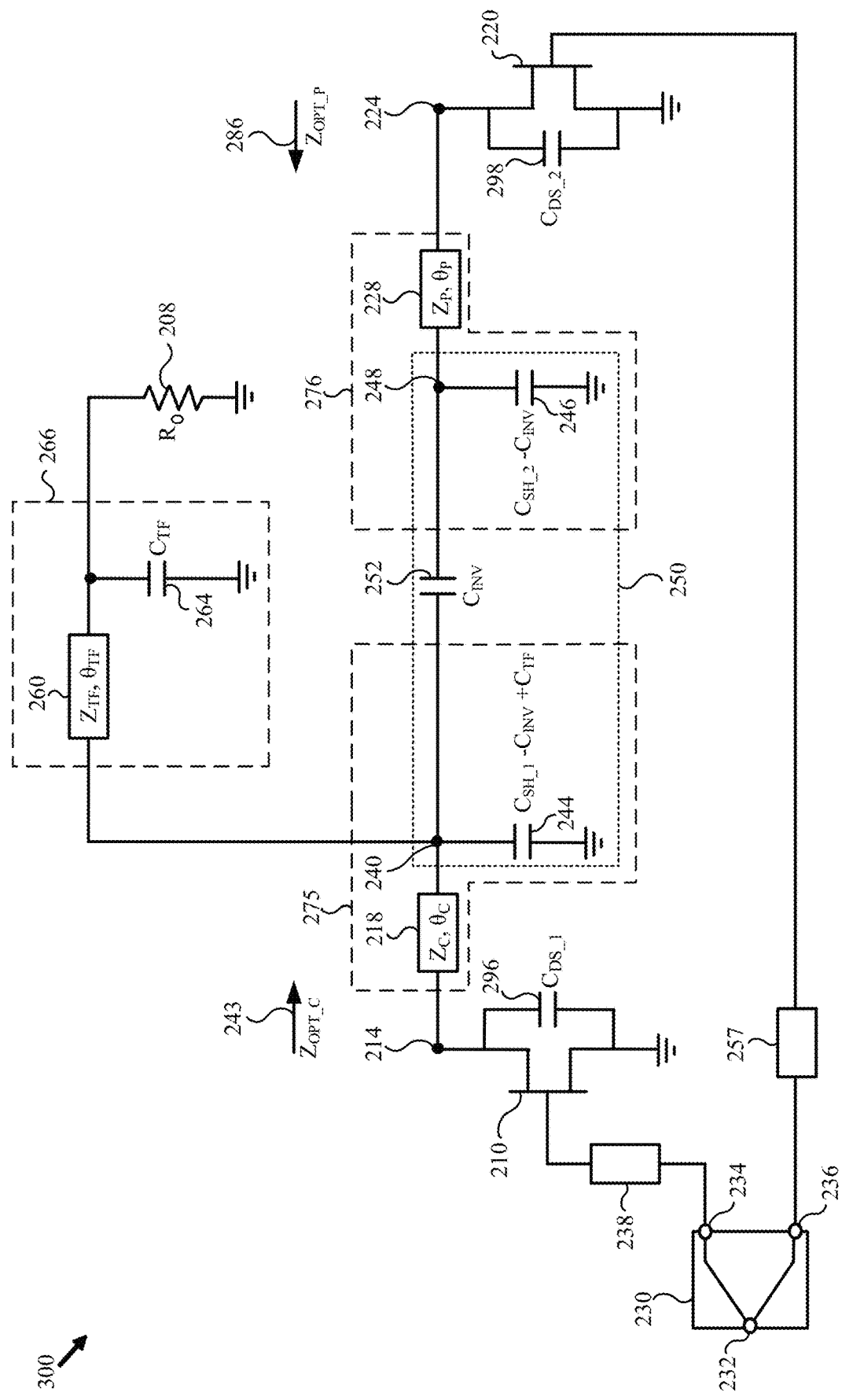
FIG. 3 depicts a schematic diagram of a Doherty amplifier in accordance with various embodiments of the disclosure.

FIG. 3 shows an equivalent circuit 300 illustrating the first and second shunt circuits/capacitors 244, 246, after absorbing the negative capacitance values of the parallel shunt circuits/capacitors 254, 256 included in the wideband impedance inverter circuit 250. As shown in FIG. 3, the first shunt capacitor 244 has absorbed the negative capacitance (e.g., capacitance $-C_{INV}$) of the parallel shunt circuit/capacitor 254. Accordingly, the parallel shunt circuit/capacitor 254 has been removed from the wideband impedance inverter circuit 250. Moreover, as previously discussed, the capacitance $C_{TF}$ of the third shunt capacitor 262 has been added to the capacitance $C_{SH\_1}$ of the first shunt circuit/capacitor 244. Accordingly, the third shunt capacitor 262 has been removed from the output impedance matching network 266. Therefore, the capacitance of the first shunt circuit/capacitor 244 in FIG. 3 may be expressed as $C_{SH\_1}-C_{INV}+C_{TF}$.

As further shown in FIG. 3, the second shunt circuit/capacitor 246 has absorbed the negative capacitance (e.g., capacitance $-C_{INV}$) of the parallel shunt circuit/capacitor 256. Accordingly, the parallel shunt circuit/capacitor 256 has also been removed from the wideband impedance inverter circuit 250. In some embodiments, each of the values of $C_{SH\_1}$ and $C_{SH\_2}$ exceeds the value of $C_{INV}$ to ensure that the circuit 300 includes positive elements. In other embodiments, the sum of the values $C_{SH\_1}$ and $C_{TF}$ exceeds the value of $C_{INV}$ and the value of $C_{SH\_2}$ exceeds the value of $C_{INV}$ to ensure that the circuit 300 includes positive elements. In some scenarios, the capacitance of the first shunt circuit/capacitor 244 expressed as $C_{SH\_1}-C_{INV}+C_{TF}$ may be equal to zero (e.g., the expression $C_{SH\_1}-C_{INV}+C_{TF}$ may amount to zero) and, therefore, the first shunt circuit/capacitor 244 may be omitted. In some scenarios, the capacitance of the second shunt circuit/capacitor 246 expressed as $C_{SH\_2}-C_{INV}$ may be equal to zero (e.g., the expression $C_{SH\_2}-C_{INV}$ may amount to zero) and, therefore, the second shunt circuit/capacitor 246 may be omitted.

Therefore, in some embodiments, the capacitance of the first shunt circuit/capacitor 144 in FIG. 1 may be expressed as $C_{SH\_1}-C_{INV}+C_{TF}$. In some examples, the capacitance $C_{SH\_1}$ may be selected to be approximately equal to the internal drain-source capacitance (also referred to as a parasitic capacitance or junction capacitance) of the first power transistor 210 (e.g., the capacitance $C_{DS\_1}$ 296). In some embodiments, the capacitance of the second shunt circuit/capacitor 146 in FIG. 1 may be expressed as $C_{SH\_2}-C_{INV}$. In some examples, the capacitance $C_{SH\_2}$ may be selected to be approximately equal to the internal drain-source capacitance (also referred to as a parasitic capacitance or junction capacitance) of the second power transistor 220 (e.g., the capacitance $C_{DS\_2}$ 298). In some embodiments, the lumped element circuit 150 in FIG. 1 may include the series capacitor 252 having the capacitance $C_{INV}$.

In some embodiments, the wideband impedance inverter circuit 250 causes the impedance seen at the output of the first power transistor 210 (e.g., $Z_{OPT\_C}$ 243) to reduce when the second power transistor 220 is ON and delivering current to the load 208. When the second power transistor 220 is OFF (e.g., during back-off operation), the optimum efficiency output impedance of the first power transistor 210 is referred to as Zmod.

In some embodiments, with reference to FIG. 3, the electrical length $\theta_C$ of the first transmission line 218 may be determined using equation 1:

$$\theta_C = \arccos(\sqrt{Z_{OPT\_C} \cdot Z_{NODE} \cdot (PowerRatio+1)} \cdot C_{DS\_1} \cdot \omega). \quad \text{(equation 1)}$$

where $Z_{OPT\_C}$ may represent the optimum load impedance of the first power transistor 210 (e.g., shown as $Z_{OPT\_C}$ 243 in FIG. 3) when the second power transistor 220 is ON, $Z_{NODE}$ may represent the combining impedance for the first and second power transistors 210, 220, the PowerRatio may represent the amount of current output from the second power transistor 220 divided by the amount of current output from the first power transistor 210, $C_{DS\_1}$ may represent the internal drain-source capacitance (also referred to as a parasitic capacitance or junction capacitance) of the first power transistor 210 (e.g., the capacitance $C_{DS\_1}$ 296 in FIG. 3), and ω may represent the angular frequency of the amplified first RF signal.

In some embodiments, with reference to FIG. 3, the characteristic impedance $Z_C$ of the first transmission line 218 may be determined using equation 2:

$$Z_C = \frac{\sqrt{Z_{OPT\_C} \cdot Z_{NODE} \cdot (PowerRatio+1)}}{\sin\theta_C} \quad \text{(equation 2)}$$

where $Z_{OPT\_C}$ may represent the optimum load impedance of the first power transistor 210 (e.g., shown as $Z_{OPT\_C}$ 243 in FIG. 3) when the second power transistor 220 is ON, $Z_{NODE}$ may represent the combining impedance for the first and second power transistors 210, 220, the PowerRatio may represent the amount of current output from the second power transistor 220 divided by the amount of current output from the first power transistor 210, and $\theta_C$ may represent the electrical length of the first transmission line 218 as previously described with reference to equation 1. In some embodiments, with reference to FIG. 3, the electrical length $\theta_P$ of the second transmission line 228 may be determined using equation 3:

$$\theta_P = \arccos\left(\frac{C_{DS\_2}}{C_{INV}} \cdot \frac{\sqrt{Z_{OPT\_C}}}{\sqrt{Z_{NODE} \cdot (PowerRatio+1)}}\right) \quad \text{(equation 3)}$$

where $Z_{OPT\_C}$ may represent the optimum load impedance of the first power transistor 210 (e.g., shown as $Z_{OPT\_C}$ 243 in FIG. 3), $Z_{NODE}$ may represent the combining impedance for the first and second power transistors 210, 220, the PowerRatio may represent the amount of current output from the second power transistor 220 divided by the amount of current output from the first power transistor 210, $C_{DS\_2}$ may represent the internal drain-source capacitance (also referred to as a parasitic capacitance or junction capacitance) of the second power transistor 220 (e.g., the capacitance $C_{DS\_2}$ 298 in FIG. 3), and $C_{INV}$ may represent the capacitance of the series capacitor 252 in the wideband impedance inverter circuit 250.

In some embodiments, with reference to FIG. 3, the characteristic impedance $Z_P$ of the first transmission line 218 may be determined using equation 4:

$$Z_P = \frac{1}{\sin\theta_P} \cdot \frac{\sqrt{\frac{1}{C_{INV}^2 \cdot \omega^2}(Z_{OPT\_C})}}{\sqrt{Z_{NODE} \cdot (PowerRatio+1)}} \quad \text{(equation 4)}$$

where $Z_{OPT\_C}$ may represent the optimum load impedance of the first power transistor 210 (e.g., shown as $Z_{OPT\_C}$ 243 in FIG. 3), $Z_{NODE}$ may represent the combining impedance for the first and second power transistors 210, 220, the PowerRatio may represent the amount of current output from the second power transistor 220 divided by the amount of current output from the first power transistor 210, $C_{INV}$ may represent the capacitance of the series capacitor 252 in the wideband impedance inverter circuit 250, ω may represent the angular frequency of the amplified second RF signal, and $\theta_P$ may represent the electrical length of the second transmission line 228 (e.g., as defined in equation 3 herein).

In some embodiments, with reference to FIG. 3, the electrical length $\theta_{TF}$ of the third transmission line 260 may be determined using equation 5:

$$\theta_{TF} = \arccos(C_{TF} \cdot \omega \cdot \sqrt{(Z_{NODE} \cdot Z_{LOAD})}). \quad \text{(equation 5)}$$

where $C_{TF}$ may represent the capacitance $C_{TF}$ of a shunt capacitor (e.g., the third shunt capacitor 262) in the output impedance matching network 266, ω may represent the angular frequency of the amplified RF output signal produced at the combining node 240, $Z_{NODE}$ may represent the combining impedance for the first and second power transistors 210, 220, and $Z_{LOAD}$ may represent the impedance of the load Ro 208.

In some embodiments, with reference to FIG. 3, the characteristic impedance $Z_{TF}$ of the third transmission line 260 may be determined using equation 6:

$$Z_{TF} = \frac{\sqrt{Z_{NODE} \cdot Z_{LOAD}}}{\sin\theta_{TF}} \quad \text{(equation 6)}$$

where $Z_{NODE}$ may represent the combining impedance for the first and second power transistors 210, 220, $Z_{LOAD}$ may represent the impedance of the load Ro 208, and $\theta_{TF}$ may represent the electrical length of the third transmission line 260 (e.g., as defined in equation 5 herein).

In some embodiments, with reference to FIG. 3, the capacitance $C_{INV}$ of the series capacitor 252 in the wideband impedance inverter circuit 250 may be determined using equation 7:

$$C_{INV} = \frac{1}{\omega \cdot Z_{C_{INV}}} \quad \text{(equation 7)}$$

where ω may represent the angular frequency of the amplified second RF signal and $Z_{C_{INV}}$ may represent the characteristic impedance of the wideband impedance inverter circuit 250.

Figure 4:
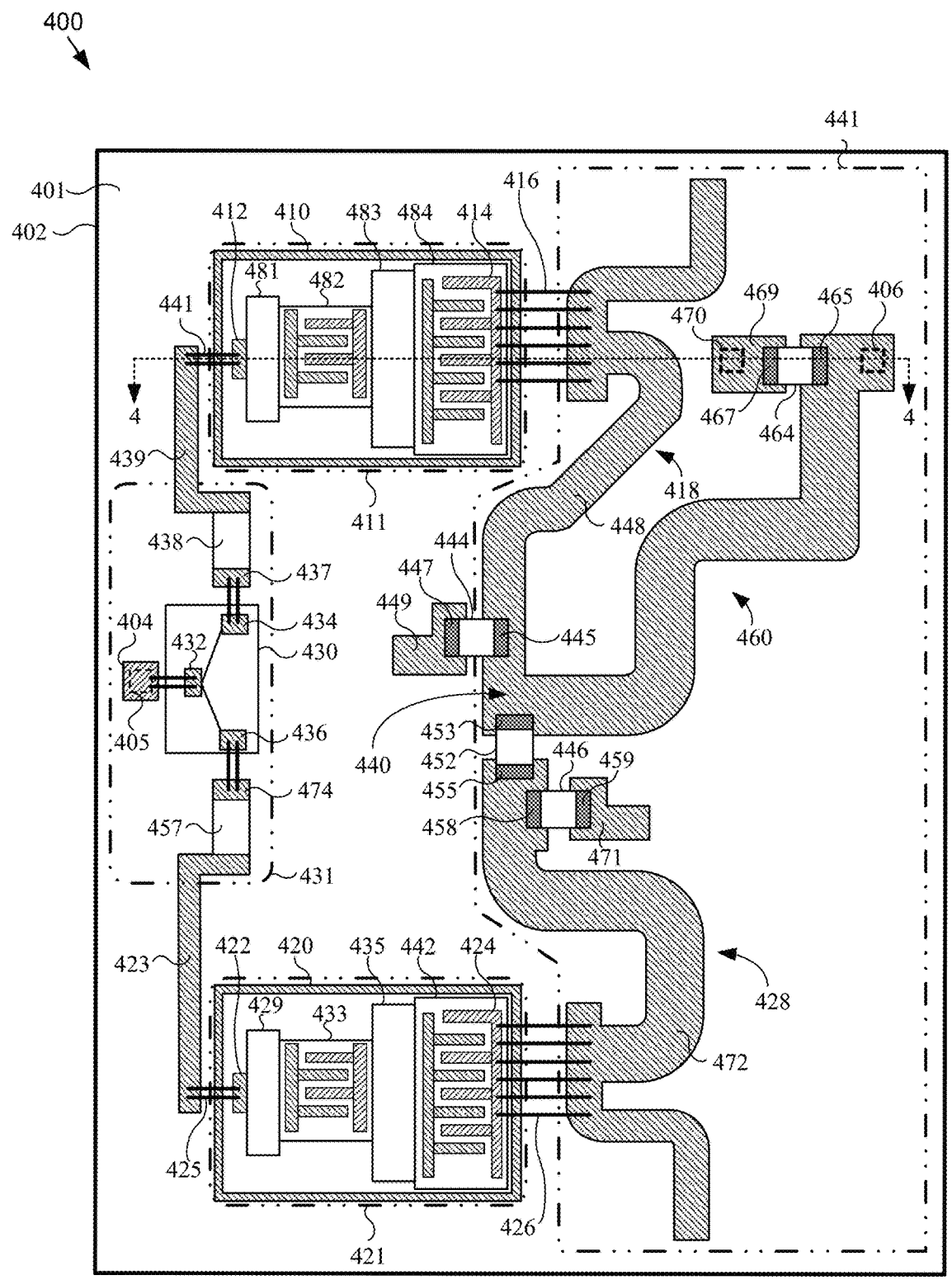
FIG. 4 depicts a top view of a Doherty amplifier module in accordance with various embodiments of the disclosure.

An embodiment of a physical implementation of the Doherty amplifier described with reference to FIGS. 1-3 will now be described in detail in conjunction with FIGS. 4 and 5. More specifically, FIG. 4 is a top view of a two-way Doherty amplifier module 400, in accordance with an example embodiment. FIG. 4 should be viewed simultaneously with FIG. 5, which is a cross-sectional, side view of the Doherty amplifier module 400 of FIG. 4 along line 4-4. Doherty amplifier module 400 includes a substrate 402, a first amplifier die 410 (e.g., first amplifier die 110, FIG. 1), a second amplifier die 420 (e.g., second amplifier die 120, FIG. 1), a power splitter 430 (e.g., power splitter 130 in FIG. 1), a first input circuit 438 (e.g., first input circuit 138 in FIG. 1), a second input circuit 457 (e.g., second input circuit 157 in FIG. 1), a first shunt circuit with a first shunt capacitor 444 (e.g., first shunt capacitor 144), a second shunt circuit with a second shunt capacitor 446 (e.g., second shunt capacitor 146), a third shunt capacitor 464 (e.g., third shunt capacitor 164), a series capacitor 452 (e.g., series capacitor 252), a first transmission line 418 (e.g., first transmission line 118), a second transmission line 428 (e.g., second transmission line 128), and a third transmission line 460 (e.g., third transmission line 160). In an embodiment, the first amplifier die 410 may be a carrier amplifier die and the second amplifier die 420 may be a peaking amplifier die.

According to an embodiment, the Doherty amplifier module 400 is implemented as a land grid array (LGA) module. Accordingly, the substrate 402 has a component mounting surface 401 and a land surface 489. According to an embodiment, the substrate 402 is relatively small, which provides for a particularly compact Doherty amplifier. For example, the component mounting surface 401 may have a width (horizontal dimension in FIG. 4) and a length (vertical dimension in FIG. 4) in a range of about 10 millimeters (mm) to about 25 mm, although the width and/or length may be smaller or larger, as well.

For example, the substrate 402 may be a multi-layer organic substrate with a plurality of metal layers 490, 491, 492, 493, 494, 495, which are separated by dielectric material. According to an embodiment, the bottom metal layer 495 is utilized to provide externally-accessible, conductive landing pads 405, 406, 470 of the LGA, where the locations of some example landing pads 405, 406, 470 are indicated with dashed boxes in FIG. 4. These landing pads 405, 406, 470 (among others, not illustrated) enable surface mounting of the Doherty amplifier module 400 onto a separate substrate (not illustrated) that provides electrical connectivity to other portions of an RF system. Although the Doherty amplifier module 400 is depicted as an LGA module, the Doherty amplifier module 400 alternatively may be packaged as a pin grid array module, a quad flat no leads (QFN) module, or another type of package.

One or more other metal layers (e.g., layers 493, 494) of the substrate 402 may be used to convey DC voltages (e.g., DC bias voltages) and to provide a ground reference. Finally, still other layers (e.g., layers 491, 492) may be used to convey RF and other signals through the module 400. Additionally, a patterned metal layer 490 may be formed on the mounting surface 401 of the substrate 402. As will be discussed in more detail below, the patterned metal layer 490 may include a plurality of conductive contacts 423, 437, 439, 448, 469, 471, 472 and 474, on the mounting surface 401, which facilitate electrical connections to dies and other components that may be mounted to the mounting surface 401. Conductive vias (e.g., vias 419, 461, 463) provide for electrical connectivity between the metal layers 490-495.

Each of the amplifier dies 410, 420, may produce significant amounts of heat during operation. In addition, each of the amplifier dies 410, 420, also need access to a ground reference. Accordingly, in an embodiment, substrate 402 also includes a plurality of electrically and thermally conductive trenches (e.g., trenches 499) to which the amplifier dies 110, 120, are coupled (e.g., with solder, brazing material, silver sinter, or other die attach materials). The trenches (e.g., trenches 499) extend through the substrate thickness in first-die and second-die mounting zones 411, 421 to provide heat sinks and ground reference access to the first and second amplifier dies 410, 420. For example, the conductive trenches 499 may be filled with copper or another thermally and electrically conductive material. In alternate embodiments, the trenches 499 may be replaced with conductive slugs (e.g., copper slugs) or with thermal vias.

Referring to the top view of module 400 in FIG. 4, a plurality of non-overlapping zones are defined at the mounting surface 401 of the substrate 402. More specifically, the non-overlapping zones include an input signal zone 431, a first-die mounting zone 411, a second-die mounting zone 421, and an output network zone 441. Within the input signal zone 431, a conductive landing pad 404 exposed at the mounting surface 401 is electrically coupled through the substrate 402 to a conductive contact 405 at the land surface 489. The landing pad 404 and contact 405, along with the electrical connections between them, function as the RF input node (e.g., RF input node 104, FIG. 1) for the module 400.

The power splitter 430 (e.g., power splitter 130 in FIG. 1) is coupled to the mounting surface 401 in the input signal zone 431. According to an embodiment, the power splitter 430 may include one or more discrete die and/or components, although it is represented in FIG. 4 as a single element. The power splitter 430 includes an input terminal 432 (e.g., input 132 in FIG. 1) and two output terminals 434, 436 (e.g., outputs 134, 136 in FIG. 1). The input terminal 432 is electrically coupled (e.g., through wirebonds, as shown, or through transmission lines) to conductive contact 404 to receive an input RF signal. In addition, the output terminals 434, 436 are electrically coupled (e.g., through additional wirebonds, as shown) to conductive contacts 437, 474 at the mounting surface 401. The power splitter 430 is configured to split the power of the input RF signal received through input terminal 432 into first and second RF signals, which are produced at the output terminals 434, 436. In some embodiments, the power splitter 430 may consist of fixed-value, passive components, or the power splitter 430 may include variable phase shifters and/or attenuators.

The first and second RF signals may have equal or unequal power, as discussed previously. The first RF signal produced at output terminal 434 and conveyed to conductive contact 437 is amplified through a first signal path, which includes a first input circuit 438 mounted within the input signal zone 431 and a first amplifier die 410 (e.g., first amplifier die 110, FIG. 1) mounted within the first-die mounting zone 411.

The illustrated embodiment of first amplifier die 410 embodies a two-stage amplifier, which includes an RF input terminal 412 (e.g., the RF input terminal 112 in FIG. 1), an input matching network 481, a driver transistor 482, an interstage matching network 483, an output transistor 484, and an RF output terminal 414 (e.g., the RF output terminal 114 in FIG. 1). The driver and output transistors 482, 484 are coupled in series, where the driver transistor 482 applies a relatively high gain to the first RF signal, and the output transistor 484 applies a relatively low gain to the first RF signal after preliminary amplification by the driver transistor 482. In other embodiments, the first amplifier die 410 may embody a single stage amplifier, or may include more than two amplification stages.

The amplified first RF signal is produced by the first amplifier die 410 at the RF output terminal 414. In an embodiment, the RF output terminal 414 is electrically coupled to the conductive contact 448 with a first wirebond array 416.

Referring back to the power splitter 430 in the input signal zone 431, the second RF signal produced at output terminal 436 of the power splitter 430 and conveyed to conductive contact 474 is amplified through a second amplifier path, which includes a second input circuit 457 mounted within the input signal zone 431 and a second amplifier die 420 (e.g., die 120, FIG. 1) mounted within the second-die mounting zone 421. In some embodiments, the first and second RF signals have a phase difference of approximately 90 degrees.

The illustrated embodiment of the second amplifier die 420 also embodies a two-stage amplifier, which includes an RF input terminal 422 (e.g., the RF input terminal 122 in FIG. 1), an input matching network 429, a driver transistor 433, an interstage matching network 435, an output transistor 442, and an RF output terminal 424 (e.g., the RF output terminal 124 in FIG. 1).

In some embodiments, the first and second amplifier dies 410, 420 are identical in size, rendering the Doherty amplifier module 400 a symmetric Doherty amplifier. In an alternate embodiment, at least one of the first and second amplifier dies 410, 420 may have a different size relative to the other amplifier die, rendering the Doherty amplifier module 400 an asymmetric Doherty amplifier. For example, the second amplifier die 420 may be larger than the first amplifier die 410 by a ratio (e.g., 1.6:1, 2:1, or some other ratio).

The amplified second RF signal is produced by the second amplifier die 420 at the RF output terminal 424 (e.g., the RF output terminal 140 of the second amplifier die 120). According to an embodiment, the RF output terminal 424 is electrically coupled to the conductive contact 472 with a second wirebond array 426 (e.g., a plurality of parallel, closely spaced wirebonds).

As shown in FIG. 4, the conductive contact 448 may be coupled to the conductive contact 472 via the series capacitor 452. For example, the series capacitor 452 may be a surface mount component and may have first and second terminals 453, 455. In this example, the first terminal 453 may be coupled (e.g., with a solder connection) to the conductive contact 448 and the second terminal 455 may be coupled (e.g., with a solder connection) to the conductive contact 472.

As shown in FIG. 4, the conductive contact 448 may be coupled to the first shunt circuit, and more particularly to the first shunt capacitor 444. For example, the first shunt capacitor 444 may be a surface mount component and may have first and second terminals 445, 447. In this example, the first terminal 445 may be coupled (e.g., with a solder connection) to the conductive contact 448 and the second terminal 447 may be coupled (e.g., with a solder connection) to the conductive contact 449. For example, the conductive contact 449 may be coupled to ground using a via (not shown). As further shown in FIG. 4, the conductive contact 472 may be coupled to the second shunt circuit, and more particularly to the second shunt capacitor 446. For example, the second shunt capacitor 446 may be a surface mount component and may have first and second terminals 458, 459. In this example, the first terminal 458 may be coupled (e.g., with a solder connection) to the conductive contact 472 and the second terminal 459 may be coupled (e.g., with a solder connection) to the conductive contact 471. For example, the conductive contact 471 may be coupled to ground using a via (not shown).

As shown in FIG. 4, the conductive contact 448 may be coupled to the third shunt capacitor 464. For example, the third shunt capacitor 464 may be a surface mount component and may have first and second terminals 465, 467. In this example, the first terminal 465 may be coupled (e.g., with a solder connection) to the conductive contact 448 and the second terminal 467 may be coupled (e.g., with a solder connection) to the conductive contact 469. For example, the conductive contact 469 may be coupled to ground through the conductive landing pad 470 (e.g., through vias 419 and 461).

In FIG. 4, the portion 418 of the conductive contact 448 may be configured as a transmission line (also referred to as first transmission line 418) having a characteristic impedance $Z_C$. The portion 428 of the conductive contact 472 may be configured as a transmission line (also referred to as second transmission line 428) having a characteristic impedance $Z_P$. The portion 460 of the conductive contact 448 may be configured as a transmission line (also referred to as third transmission line 460) having a characteristic impedance $Z_{TF}$.

In some embodiments, the first transmission line 418 and the first shunt capacitor 444 may form a first output circuit (e.g., first output circuit 275 in FIG. 3) for the first amplifier die 410, the second transmission line 428 and the second shunt capacitor 446 may form a second output circuit (e.g., second output circuit 276 in FIG. 3) for the second amplifier die 420, and the third transmission line 460 and the third shunt capacitor 464 may form an output impedance matching network (e.g., output impedance matching network 266 in FIG. 3).

In some embodiments, the series capacitor 452 and the first and second shunt circuits/capacitors 444, 446 may form a PI network that operates as a wideband impedance inverter circuit (e.g., wideband impedance inverter circuit 250 in FIG. 3). In one embodiment, the series capacitor 452 (e.g., series capacitor 252 in FIG. 3) may have a capacitance $C_{INV}$, the first shunt circuit/capacitor 444 (e.g., the first shunt capacitor 244 in FIG. 3) may have a capacitance expressed as $C_{SH\_1}-C_{INV}+C_{TF}$, and the second shunt circuit/capacitor 446 (e.g., the second shunt capacitor 246 in FIG. 3) may have a capacitance expressed as $C_{SH\_2}-C_{INV}$. In one example implementation, the capacitance $C_{SH\_1}$ may be selected to be approximately equal to the internal drain-source capacitance of the output power transistor 484 and the capacitance $C_{SH\_2}$ may be selected to be approximately equal to the internal drain-source capacitance of the output power transistor 442. In one example implementation, the third shunt capacitor 464 may have a capacitance $C_{TF}$.

In FIG. 4, the first output circuit including the first transmission line 418 and the first shunt circuit/capacitor 444 is configured to apply a first phase shift to the amplified first RF signal between the RF output terminal 414 and the combining node 440. The second output circuit including the second transmission line 428 and the second shunt circuit/capacitor 446 is configured to apply a second phase shift (e.g., a lag phase shift) to the amplified second RF signal. The wideband impedance inverter circuit including the series capacitor 452 and the first and second shunt circuits/capacitors 444, 446 is configured to apply a third phase shift (e.g., a lead phase shift) to the amplified second RF signal.

In one example, the first, second, and third phase shifts may each be approximately 90 degrees. In this example, the Doherty amplifier module 400 may be considered a 90°/0° Doherty amplifier module since an approximately 90 degree phase shift (e.g., the first phase shift) is applied between the RF output terminal 414 and the combining node 440, and an approximately zero degree phase shift is applied between the RF output terminal 424 and the combining node 440. For example, the zero degree phase shift may result from the sum of the second phase shift (e.g., an approximately 90 degree lag phase shift) applied by the second output circuit and the third phase shift (e.g., an approximately 90 degree lead phase shift) applied by the wideband impedance inverter circuit.

It should be noted that the third phase shift is applied by the wideband impedance inverter circuit without using a transmission line (e.g., a quarter wavelength transmission line). As such, the Doherty amplifier module 400 avoids the need for a relatively lengthy and wide conductive path on the mounting surface 401 of the substrate 402, which would typically be needed for implementation of the previously discussed transmission line (e.g., a quarter wavelength transmission line). Consequently, the footprint of the Doherty amplifier module 400 may be significantly smaller as compared to conventional 90°/180° Doherty amplifiers that implement a transmission line (e.g., a quarter wavelength transmission line) to achieve each phase shift.

In an embodiment, during operation of the Doherty amplifier module 400, the combining region 440 (also referred to as the combining node 440) on the conductive contact 448 may combine (e.g., sum) the amplified first RF signal with the amplified second RF signal in phase to produce an amplified RF output signal. The amplified RF output signal at the combining node 440 may be provided to the load (e.g., load 108 in FIG. 1) through the third transmission line 460 and the conductive landing pad 406.

Although not illustrated in FIG. 4, module 400 also includes bias circuitry configured to provide gate and drain bias voltages to some or all of the driver and output transistors 433, 442, 482, 484. For example, the bias circuitry may include, among other things, a plurality of landing pads (at the land surface 489 of the substrate 402), contacts (at the mounting surface 401 of the substrate 402), and other conductive structures and circuitry. Bias voltages provided to the gates and/or drains of the transistors 433, 442, 482, 484 facilitate Doherty operation of the module 400. For example, the transistors 482, 484 of the first amplifier die 410 may be biased to operate in class AB mode, and the transistors 433, 442 of the second amplifier die 420 may be biased to operate in class C mode.

Figure 5:
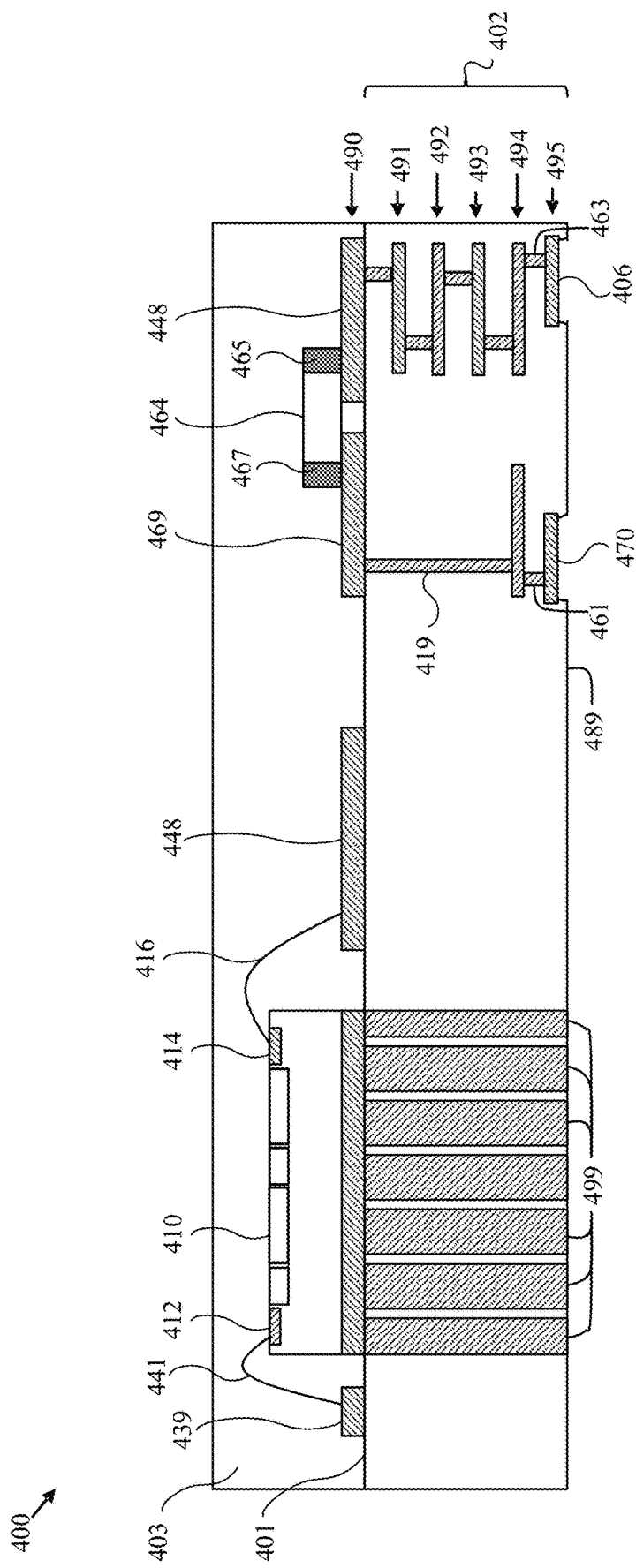
FIG. 5 depicts a cross-sectional, side view of the module of FIG. 4 along line 4-4.

According to an embodiment, all of the components mounted to the mounting surface 401 of the substrate 402 are encapsulated with non-conductive encapsulation material 403 (FIG. 5). In an alternate embodiment, the components could be contained within an air cavity, which is defined by various structures (not illustrated) overlying the mounting surface 401.

The first and second amplifier dies 410, 420 may be implemented using various types of semiconductor substrates, such as silicon, silicon-on-insulator (SOI), silicon-on-sapphire (SOS), gallium arsenide (GaAs), gallium nitride (GaN), GaN on silicon carbide, GaN on silicon, or other types of substrate materials. Further, each of the transistors 433, 442, 482, 484 of the first and second amplifier dies 410, 420 may be a field effect transistor (FET) (such as a metal oxide semiconductor FET (MOSFET), a laterally diffused MOSFET (LDMOS FET), a high electron mobility transistor (HEMT), and so on), which includes a gate (control terminal), a source (a first current conducting terminal), and a drain (a second current conducting terminal). Alternatively, each of the transistors 433, 442, 482, 484 may be a bipolar junction transistor (BJT). References herein to a "gate," "drain," and "source," which are commonly used to describe FETs, are not intended to be limiting, as each of these designations has analogous features for a BJT implementation (e.g., a base, collector, and emitter, respectively).

Various modifications may be made to module 400 without departing from the scope of the inventive subject matter. For example, although substrate 402 is depicted, in FIG. 5, to include six metal layers 490-495, substrates that include more or fewer metal layers alternatively may be used. In addition, other types of substrates alternatively could be used, including ceramic substrates or other types of substrates. Further, alternate embodiments may include a power splitter and/or amplifier die that are configured as flip-chips. In addition, the first and second amplifier dies 410, 420 may include single stage amplifiers, or each of the first and second amplifiers 410, 420 may be replaced with two distinct amplifier die (one driver amplifier die and one output amplifier die). In addition to the above, the module 400 also may include various discrete and/or integrated components (e.g., capacitors, inductors, and/or resistors) electrically coupled to the first and second input circuits 438, 457 to provide a desired phase delay (e.g., an approximately 90 degree phase shift).

Figure 6:
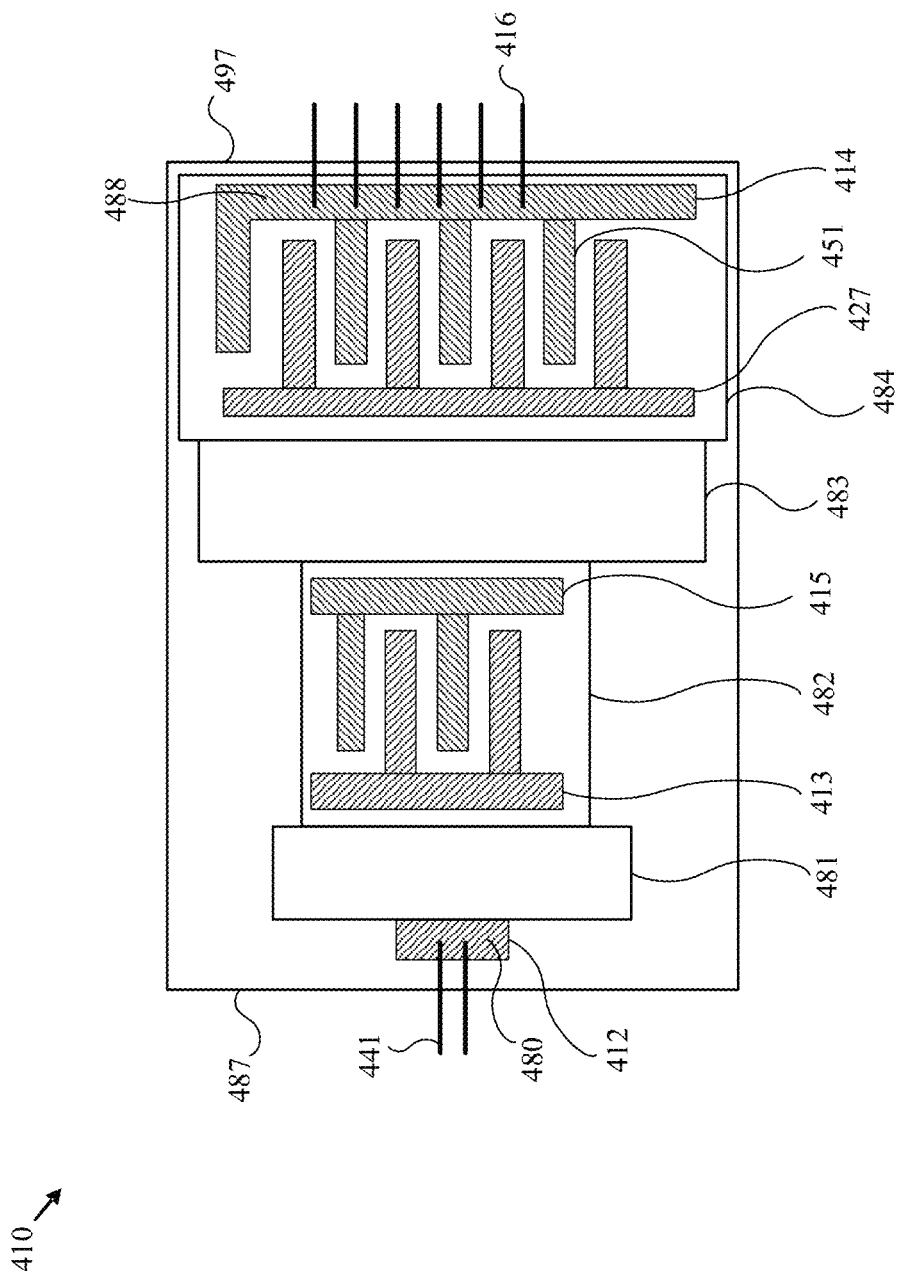
FIG. 6 depicts an enlarged top view of a first amplifier die in accordance with various embodiments of the disclosure.

FIG. 6 depicts an enlarged top view of the first amplifier die 410. As discussed previously in conjunction with FIG. 4, the electrical components of the first amplifier die 410 include RF input terminal 412, an input matching network 481, a driver transistor 482, an interstage matching network 483, an output transistor 484, and an RF output terminal 414.

According to an embodiment, the RF input terminal 412 is configured to enable an array or plurality of wirebonds 441 to be coupled in parallel with each other to the RF input terminal 412. More specifically, the RF input terminal 412 includes an elongated, conductive pad 480 that is proximate to the first side 487 of the first amplifier die 410, and that has a length that extends in parallel with the first side 487 of the first amplifier die 410. According to an embodiment, the length of the pad 480 is large enough to enable a plurality of wirebonds (e.g., from 2 to 10 or more) to be connected in parallel with each other along the length of the pad 480. As shown in FIG. 6, the length of the pad 480 is large enough to enable the plurality of wirebonds 441 to be connected so that they can extend in a perpendicular direction from side 487.

The RF input terminal 412 of the first amplifier die 410 is electrically coupled to the gate terminal 413 of transistor 482 through input matching network 481, and the drain terminal 415 of transistor 482 is electrically coupled to the gate terminal 427 of transistor 484 through inter-stage matching network 483. Accordingly, the signal path through the first amplifier die 410 is in a direction extending from the first side 487 toward the second side 497, or from the RF input terminal 412 toward the RF output terminal 414.

In FIG. 6, the RF output terminal 414 includes an elongated main pad 488 and a first set of wirebonds 416 connected in parallel with respect to one another along the length of the elongated main pad 488. In FIG. 6, the set of wirebonds 416 includes six wirebonds. In alternate embodiments, the length of the elongated main pad 488 may be sufficient to enable more (e.g., seven or more) wirebonds to be connected in parallel along the length of the elongated main pad 488.

The driver and output transistors 482, 484 are coupled in series between the RF input and output terminals 412, 414, where the driver transistor 482 is configured to apply a relatively high gain to the first RF signal (e.g., carrier signal), and the output transistor 484 is configured to apply a relatively low gain to the first RF signal after preliminary amplification by the driver transistor 482. In the illustrated embodiment, each of transistors 482, 484 includes interdigitated source and drain "fingers" (i.e., elongated source regions and drain regions in and proximate to the top surface of the first amplifier die 410), with gate terminals 413, 427 (control terminals) interdigitated with the source and drain fingers. Each of the gate terminals 413, 427 consists of a set of elongated conductive gate terminal fingers and a common conductive gate bar interconnecting the gate terminal fingers. Drain terminals 415, 414 (current conducting terminals) convey current from the drain regions of the transistors 482, 484. Similar to the gate terminals 413, 427, each drain terminal 415, 414 may consist of a set of elongated conductive drain terminal fingers (interdigitated with the gate terminal fingers), along with a common conductive drain bar interconnecting the drain terminal fingers. Although various numbers of gate and drain fingers are illustrated in FIG. 6, a device may include more or fewer fingers, and/or the transistors may have structures other than the interdigitated finger structures discussed herein.

Figure 7:
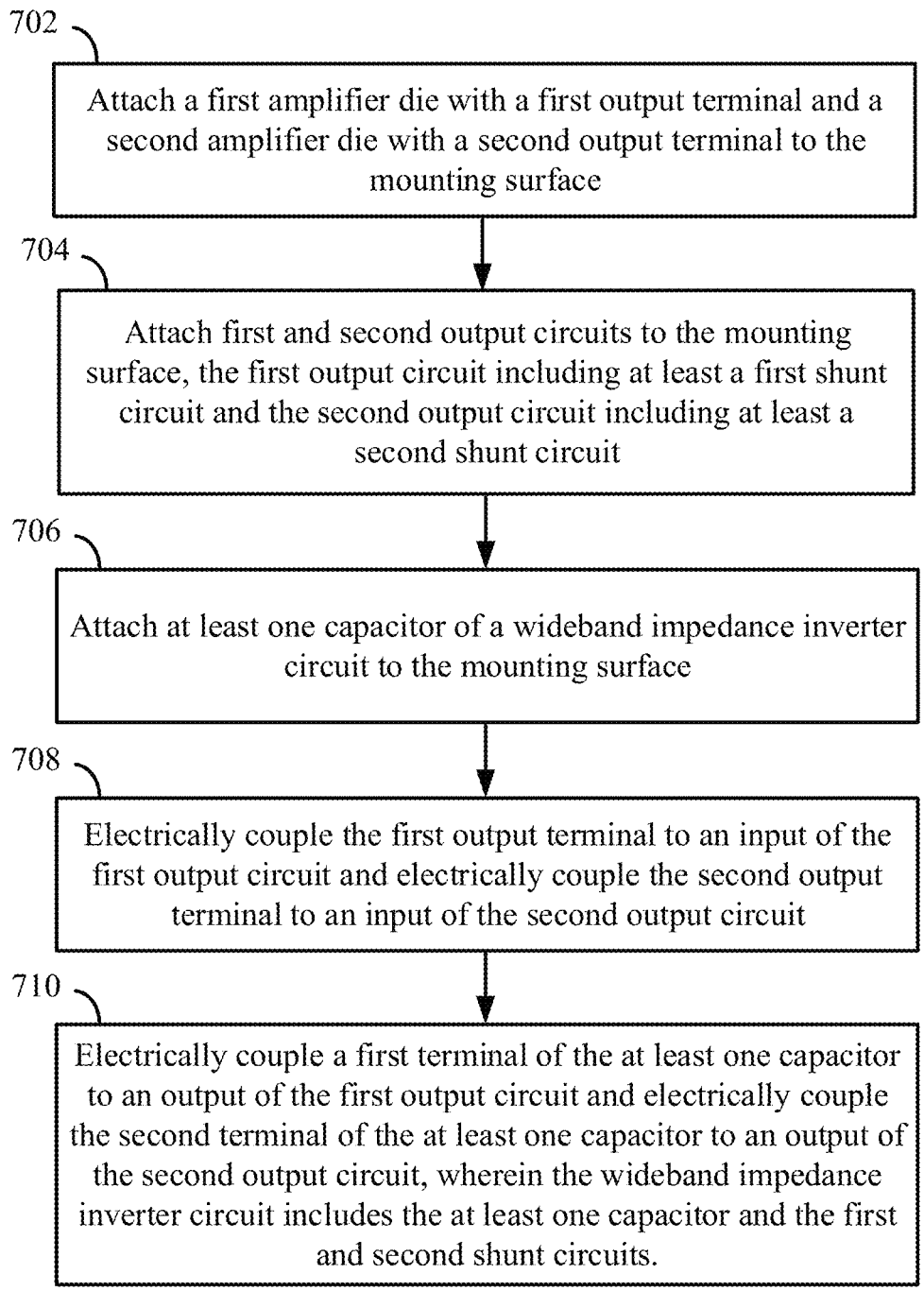
FIG. 7 is a flowchart of a method for fabricating a Doherty amplifier module in accordance with various embodiments of the disclosure.

FIG. 7 is a flow diagram of a method for fabricating a Doherty amplifier module (e.g., Doherty amplifier module 400, FIG. 4), in accordance with an example embodiment. With reference to FIG. 7, at block 702, the method involves attaching a first amplifier die (e.g., first amplifier die 410) with a first output terminal (e.g., RF output terminal 414) and a second amplifier die (e.g., second amplifier die 420) with a second output terminal (e.g., RF output terminal 424) to the mounting surface (e.g., component mounting surface 401) of a substrate.

At block 704, the method involves attaching first and second output circuits to the mounting surface, the first output circuit including at least a first shunt circuit/capacitor (e.g., first shunt circuit/capacitor 444) and the second output circuit including at least a second shunt circuit/capacitor (e.g., second shunt circuit/capacitor 446).

At block 706, the method involves attaching at least one capacitor (e.g., series capacitor 452) of a wideband impedance inverter circuit to the mounting surface.

At block 708, the method involves electrically coupling the first output terminal to an input of the first output circuit (e.g., the RF output terminal 414 is electrically coupled to the conductive contact 448 with a first wirebond array 416) and electrically coupling the second output terminal to an input of the second output circuit (e.g., the RF output terminal 424 is electrically coupled to the conductive contact 472 with a second wirebond array 426).

At block 710, the method involves electrically coupling a first terminal (e.g., terminal 453) of the at least one capacitor to an output of the first output circuit (e.g., conductive contact 448 at the combining region 440) and electrically coupling the second terminal (e.g., terminal 455) of the at least one capacitor to an output of the second output circuit (e.g., conductive contact 472). The wideband impedance inverter circuit may include the at least one capacitor and the first and second shunt circuits/capacitors.

Therefore, the embodiments described herein provide a Doherty amplifier module that includes a wideband impedance inverter circuit (e.g., wideband impedance inverter circuit 250). In some embodiments, the wideband impedance inverter circuit may be implemented in a 90°/0° Doherty amplifier module and may apply a phase shift (e.g., an approximately 90 degree phase shift) to an amplified RF signal produced by a peaking amplifier die (e.g., second amplifier die 120 in FIG. 1). Since the wideband impedance inverter circuit may be implemented using a compact lumped element network including at least one series capacitor having a positive capacitance and at least two shunt parallel circuits/capacitors having negative capacitances (where the negative capacitances of the shunt parallel circuits/capacitors may be absorbed by adjacent capacitors, such as capacitors 244, 246), the footprint (e.g., surface area) of the 90°/0° Doherty amplifier module may be significantly reduced as compared to conventional Doherty amplifier modules. In other words, the wideband impedance inverter circuit described herein avoids the need for the previously described quarter wavelength transmission line as used in conventional 90°/180° Doherty amplifier architectures, which may consume a significant amount of area on a mounting surface of a substrate. As a result, the size of the Doherty amplifier module described herein may be significantly reduced relative to conventional Doherty amplifier modules.

In addition, the wideband impedance inverter circuit may enable improved phase alignment between the amplified first and second RF signals by applying a constant phase shift (e.g., an approximately 90 degree phase shift) to the amplified second RF signal independent of the frequency of the amplified second RF signal. For example, the lumped element PI network of the wideband impedance inverter circuit 250 may apply a phase shift of approximately 90 degrees to the amplified second RF signal despite a significant variation (e.g., variations up to and exceeding 400 MHz) in the frequency of the amplified second RF signal. Such improved phase alignment may enable the Doherty amplifier module described herein to maintain high power efficiency despite variations in RF signal frequency.

Finally, the wideband impedance inverter circuit described herein may improve the performance of the Doherty amplifier module by providing an extended impedance bandwidth relative to the impedance bandwidth of a quarter wave transmission line used in conventional Doherty amplifier modules. For example, the wideband impedance inverter circuit may provide a sufficiently large impedance (e.g., when the Doherty amplifier module is operating in back-off mode) between the combining node 240 and the signal path of the amplified second RF signal (e.g., the impedance observed at the combining node 240 when looking toward the second power transistor 220) over an extended range of frequencies as compared to the previously described limited impedance bandwidth of a quarter wavelength transmission line.

Example Implementation of a Doherty Amplifier Module

In some embodiments, a Doherty amplifier module (e.g., Doherty amplifier 100) may include a first amplifier die (e.g., first amplifier die 110) with a first output terminal (e.g., RF output terminal 114), and a second amplifier die (e.g., second amplifier die 120) with a second output terminal (e.g., RF output terminal 124). The Doherty amplifier module may further include a wideband impedance inverter circuit (e.g., wideband impedance inverter circuit 150, 250) electrically coupled between the first and second output terminals. The wideband impedance inverter circuit may contain a network of capacitances and possibly other passive components (e.g., resistors and/or inductors). For example, the network of capacitors may include at least a series capacitor (e.g., series capacitor 252) having a positive capacitance, a first shunt circuit/capacitor (e.g., shunt capacitor 254) having a first negative capacitance and a second shunt circuit/capacitor (e.g., shunt capacitor 256) having a second negative capacitance.

In some embodiments, the first shunt circuit/capacitor (e.g., shunt capacitor 254) may be coupled to a first terminal of the series capacitor (e.g., series capacitor 252) and the second shunt circuit/capacitor (e.g., shunt capacitor 256) may be coupled to a second terminal of the series capacitor. The magnitude of the positive capacitance (e.g., capacitance $C_{INV}$) of the series capacitor may be approximately equal to the magnitude of the first negative capacitance (e.g., capacitance $-C_{INV}$) of the first shunt circuit/capacitor and the magnitude of the second negative capacitance (e.g., capacitance $-C_{INV}$) of the second shunt circuit/capacitor. For example, the first and second shunt circuits/capacitors may each have a negative capacitance value of −2.5 picofarads (pF), and the series capacitor may have a positive capacitance value of 2.5 pF. In other words, the absolute value of each of the negative capacitances of the first and second shunt circuits is approximately equal to the positive capacitance of the series capacitor. As used herein, the term "approximately equal" means equal or within a range of ±5%.

In some embodiments, the Doherty amplifier module may further include a first output circuit (e.g., first output circuit 175, 275) coupled between the first output terminal of the first amplifier die and an output (e.g., combining node 140, 240) of the wideband impedance inverter circuit. For example, the first output circuit may include at least a third shunt circuit/capacitor (e.g., shunt capacitor 244) adjacent to the first shunt circuit/capacitor (e.g., shunt capacitor 254). The first negative capacitance of the first shunt circuit/capacitor may be absorbed by the third shunt circuit/capacitor. The Doherty amplifier module may further include a second output circuit (e.g., second output circuit 176, 276) coupled between the second output terminal of the second amplifier die and an input (e.g., node 248) of the wideband impedance inverter circuit. For example, the second output circuit may include at least a fourth shunt circuit/capacitor (e.g., shunt capacitor 246) adjacent to the second shunt circuit/capacitor (e.g., shunt capacitor 256). The second negative capacitance of the second shunt circuit/capacitor may be absorbed by the fourth shunt circuit/capacitor.

In some embodiments, the series capacitor, and the third and fourth shunt capacitors may be lumped elements.

In some embodiments, the Doherty amplifier may include a first output circuit (e.g., first output circuit 175, 275) coupled between the first output terminal of the first amplifier die and an output (e.g., combining node 140, 240) of the wideband impedance inverter circuit, and a second output circuit (e.g., second output circuit 176, 276) coupled between the second output terminal of the second amplifier die and an input (e.g., node 248) of the wideband impedance inverter circuit. The first output circuit may be configured to apply a first phase shift (e.g., an approximately 90 degree phase shift) to a first amplified RF signal produced by the first amplifier die, the second output circuit may be configured to apply a second phase shift (e.g., an approximately 90 degree phase shift) to a second amplified RF signal produced by the second amplifier die, and the wideband impedance inverter circuit may be configured to apply a third phase shift (e.g., an approximately 90 degree phase shift) to the second amplified RF signal. The wideband impedance inverter circuit may be configured to apply the third phase shift without using a transmission line (e.g., a quarter wavelength transmission line).

In some embodiments, an amount of the third phase shift applied by the wideband impedance inverter circuit may be constant over a frequency range of the second amplified RF signal.

In some embodiments, the output of the wideband impedance inverter circuit may be electrically coupled to a combining node configured to combine the first amplified RF signal and the second amplified RF signal. The first and second amplified RF signals may arrive approximately in phase at the combining node.

In some embodiments, the wideband impedance inverter circuit may provide an extended impedance bandwidth. For example, when the second amplifier die is not conducting current (i.e., "off"), the extended impedance bandwidth may exceed an impedance bandwidth of a transmission line (e.g., a quarter wavelength transmission line).

The preceding detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or detailed description.

The connecting lines shown in the various figures contained herein are intended to represent exemplary functional relationships and/or physical couplings between the various elements. It should be noted that many alternative or additional functional relationships or physical connections may be present in an embodiment of the subject matter. In addition, certain terminology may also be used herein for the purpose of reference only, and thus are not intended to be limiting, and the terms "first", "second" and other such numerical terms referring to structures do not imply a sequence or order unless clearly indicated by the context.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common node).

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with, electrically or otherwise) another element, and not necessarily mechanically. Thus, although the schematic shown in the figures depict one exemplary arrangement of elements, additional intervening elements, devices, features, or components may be present in an embodiment of the depicted subject matter.

While at least one exemplary embodiment has been presented in the foregoing detailed description, it should be appreciated that a vast number of variations exists. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A Doherty amplifier module comprising:
a first amplifier die with a first output terminal;
a second amplifier die with a second output terminal; and
a wideband impedance inverter circuit electrically coupled between the first and second output terminals, wherein the wideband impedance inverter circuit includes a network of capacitors, the network of capacitors including at least a series capacitor having a positive capacitance, a first shunt circuit having a first negative capacitance, and a second shunt circuit having a second negative capacitance.

2. The Doherty amplifier of claim 1, wherein the first shunt circuit is coupled to a first terminal of the series capacitor and the second shunt circuit is coupled to a second terminal of the series capacitor, and wherein a magnitude of the positive capacitance of the series capacitor is approximately equal to a magnitude of the first negative capacitance of the first shunt circuit and a magnitude of the second negative capacitance of the second shunt circuit.

3. The Doherty amplifier of claim 1, further comprising:
a first output circuit coupled between the first output terminal of the first amplifier die and an output of the wideband impedance inverter circuit, the first output circuit including at least a third shunt capacitor adjacent to the first shunt circuit, wherein the first negative capacitance of the first shunt circuit is absorbed by the third shunt capacitor; and
a second output circuit coupled between the second output terminal of the second amplifier die and an input of the wideband impedance inverter circuit, the second output circuit including at least a fourth shunt capacitor adjacent to the second shunt circuit, wherein the second negative capacitance of the second shunt circuit is absorbed by the fourth shunt capacitor.

4. The Doherty amplifier of claim 3, wherein the series capacitor, and the third and fourth shunt capacitors are lumped elements.

5. The Doherty amplifier of claim 1, further comprising:
a first output circuit coupled between the first output terminal of the first amplifier die and an output of the wideband impedance inverter circuit; and
a second output circuit coupled between the second output terminal of the second amplifier die and an input of the wideband impedance inverter circuit,
wherein the first output circuit is configured to apply a first phase shift to a first amplified radio frequency (RF) signal produced by the first amplifier die, the second output circuit is configured to apply a second phase shift to a second amplified RF signal produced by the second amplifier die, and the wideband impedance inverter circuit is configured to apply a third phase shift to the second amplified RF signal, wherein the wideband impedance inverter circuit is configured to apply the third phase shift without using a quarter wavelength transmission line.

6. The Doherty amplifier of claim 5, wherein an amount of the third phase shift applied by the wideband impedance inverter circuit is constant over a frequency range of the second amplified RF signal.

7. The Doherty amplifier of claim 5, wherein the output of the wideband impedance inverter circuit is electrically coupled to a combining node configured to combine the first amplified RF signal and the second amplified RF signal, wherein the first, second, and third phase shifts are each approximately 90 degrees, and wherein the first output circuit, the second output circuit, and the wideband impedance inverter circuit are configured so that, during operation of the Doherty amplifier, the first and second amplified RF signals arrive approximately in phase at the combining node.

8. The Doherty amplifier of claim 5, wherein the wideband impedance inverter circuit provides an extended impedance bandwidth.

9. A Doherty amplifier module comprising:
a carrier amplifier with a first output terminal;
a peaking amplifier with a second output terminal;
a first output circuit including at least a first surface mount capacitor, wherein an input of the first output circuit is coupled to the first output terminal;
a second output circuit including at least a second surface mount capacitor, wherein an input of the second output circuit is coupled to the second output terminal; and
a third surface mount capacitor, wherein a first terminal of the third surface mount capacitor is coupled to an output of the first output circuit, and wherein the second terminal of the third surface mount capacitor is coupled to an output of the second output circuit, and
wherein the first, second, and third surface mount capacitors operate as a wideband impedance inverter circuit,
wherein the first, second, and third surface mount capacitors are configured to form a PI network, wherein the first and second surface mount capacitors are shunt capacitors in the PI network and third surface mount capacitor is a series capacitor in the PI network,
wherein the first output circuit is configured to apply a first phase shift to a first amplified radio frequency (RF) signal produced by the carrier amplifier, the second output circuit is configured to apply a second phase shift to a second amplified RF signal produced by the peaking amplifier, and wherein the PI network is configured to apply a third phase shift to the second amplified RF signal produced by the peaking amplifier, and
wherein an amount of the third phase shift applied by the PI network is constant over a frequency range of the second amplified RF signal.

10. A Doherty amplifier module comprising:
a carrier amplifier with a first output terminal;
a peaking amplifier with a second output terminal;
a first output circuit including at least a first surface mount capacitor, wherein an input of the first output circuit is coupled to the first output terminal;
a second output circuit including at least a second surface mount capacitor, wherein an input of the second output circuit is coupled to the second output terminal; and
a third surface mount capacitor, wherein a first terminal of the third surface mount capacitor is coupled to an output of the first output circuit, and wherein the second terminal of the third surface mount capacitor is coupled to an output of the second output circuit, and
wherein the first, second, and third surface mount capacitors operate as a wideband impedance inverter circuit,
wherein the first, second, and third surface mount capacitors are configured to form a PI network, wherein the first and second surface mount capacitors are shunt capacitors in the PI network and third surface mount capacitor is a series capacitor in the PI network, wherein the first output circuit is configured to apply a first phase shift to a first amplified radio frequency (RF) signal produced by the carrier amplifier, the second output circuit is configured to apply a second phase shift to a second amplified RF signal produced by the peaking amplifier, and wherein the PI network is configured to apply a third phase shift to the second amplified RF signal produced by the peaking amplifier, and wherein the first, second, and third phase shifts are each approximately 90 degrees.

11. The Doherty amplifier module of claim 9, wherein the output of the first output circuit is electrically coupled to a combining node configured to combine the first amplified RF signal and the second amplified RF signal, and wherein the first and second amplified RF signals arrive approximately in phase at the combining node.

12. A method of fabricating a Doherty amplifier module, the method comprising:

attaching a first amplifier die with a first output terminal and a second amplifier die with a second output terminal to the mounting surface;

attaching first and second output circuits to the mounting surface, the first output circuit including at least a first shunt circuit and the second output circuit including at least a second shunt circuit;

attaching at least one capacitor of a wideband impedance inverter circuit to the mounting surface;

electrically coupling the first output terminal to an input of the first output circuit and electrically coupling the second output terminal to an input of the second output circuit; and electrically coupling a first terminal of the at least one capacitor to an output of the first output circuit and electrically coupling the second terminal of the at least one capacitor to an output of the second output circuit, wherein the wideband impedance inverter circuit includes the at least one capacitor and the first and second shunt circuits, and wherein the at least one capacitor and the first and second shunt circuits form a PI network, and wherein the at least one capacitor comprises at least one series capacitor, wherein the first output circuit is configured to apply a first phase shift to a first amplified radio frequency (RF) signal produced by the first amplifier die, the second output circuit is configured to apply a second phase shift to a second amplified RF signal produced by the second amplifier die, and wherein the lumped element PI network is configured to apply a third phase shift to the second amplified RF signal produced by the second amplifier die, and wherein the first, second, and third phase shifts are each approximately 90 degrees.

13. The method of claim 12, wherein the at least one capacitor and the first and second shunt circuits include surface mount components.

* * * * *